(12) United States Patent
Li et al.

(10) Patent No.: US 12,068,246 B2
(45) Date of Patent: Aug. 20, 2024

(54) REDISTRIBUTION LAYER LAYOUTS ON INTEGRATED CIRCUITS AND METHODS FOR MANUFACTURING THE SAME

(71) Applicant: Taiwan Semiconductor Manufacturing Company, Ltd., Hsinchu (TW)

(72) Inventors: Cheng-Yuan Li, Kaohsiung (TW); Kuo-Cheng Lee, Tainan (TW); Yun-Wei Cheng, Taipei (TW); Yen-Liang Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 479 days.

(21) Appl. No.: 16/201,925

(22) Filed: Nov. 27, 2018

(65) Prior Publication Data

US 2019/0109086 A1 Apr. 11, 2019

Related U.S. Application Data

(63) Continuation-in-part of application No. 15/965,116, filed on Apr. 27, 2018, now Pat. No. 11,791,299.

(60) Provisional application No. 62/592,701, filed on Nov. 30, 2017.

(51) Int. Cl.
*H01L 23/528* (2006.01)
*H01L 23/00* (2006.01)
*H01L 23/522* (2006.01)
*H01L 23/544* (2006.01)

(52) U.S. Cl.
CPC ........ *H01L 23/528* (2013.01); *H01L 23/5226* (2013.01); *H01L 23/544* (2013.01); *H01L 24/09* (2013.01); *H01L 2223/54426* (2013.01); *H01L 2224/0231* (2013.01); *H01L 2224/02331* (2013.01); *H01L 2224/02373* (2013.01)

(58) Field of Classification Search
CPC ....... H01L 23/528; H01L 24/09; H01L 24/82; H01L 2224/211; H01L 2224/24145; H01L 23/544; H01L 23/5226; H01L 24/06; H01L 24/94; H01L 2223/54426; H01L 2224/0231; H01L 2224/02373
USPC .......................... 257/773; 438/455, 598, 622
See application file for complete search history.

(56) References Cited

U.S. PATENT DOCUMENTS 8,242,543 B2  8/2012 Chandrasekaran et al.
8,829,657 B2  9/2014 Kim et al.
8,956,951 B2  2/2015 Yokokawa et al.
(Continued)

FOREIGN PATENT DOCUMENTS

CN  103367397 A  10/2013
TW  201133771 A  10/2011
(Continued)

*Primary Examiner* — Khiem D Nguyen
(74) *Attorney, Agent, or Firm* — Slater Matsil, LLP

(57) ABSTRACT

Exemplary embodiments for redistribution layers of integrated circuit components are disclosed. The redistribution layers of integrated circuit components of the present disclosure include one or more arrays of conductive contacts that are configured and arranged to allow a bonding wave to displace air between the redistribution layers during bonding. This configuration and arrangement of the one or more arrays minimize discontinuities, such as pockets of air to provide an example, between the redistribution layers during the bonding.

20 Claims, 19 Drawing Sheets

(56) References Cited

U.S. PATENT DOCUMENTS

| | | |
|---|---|---|
| 9,153,565 B2 | 10/2015 | Chen et al. |
| 10,014,340 B2 | 7/2018 | Yang et al. |
| 10,109,487 B2 | 10/2018 | Kurz et al. |
| 2003/0043565 A1 | 3/2003 | Juang |
| 2003/0122243 A1 | 7/2003 | Lee et al. |
| 2014/0199834 A1 | 7/2014 | Gu et al. |
| 2014/0231887 A1* | 8/2014 | Chen ............... H01L 27/14643 257/291 |
| 2016/0155724 A1 | 6/2016 | Kim et al. |
| 2016/0197055 A1* | 7/2016 | Yu ..................... H01L 24/81 257/737 |
| 2018/0040584 A1* | 2/2018 | Kang ............... H01L 27/14634 |

FOREIGN PATENT DOCUMENTS

| | | |
|---|---|---|
| TW | 201351629 A | 12/2013 |
| TW | 201724488 A | 7/2017 |
| TW | 201739562 A | 11/2017 |

\* cited by examiner

REDISTRIBUTION LAYER LAYOUTS ON INTEGRATED CIRCUITS AND METHODS FOR MANUFACTURING THE SAME

PRIORITY CLAIM AND CROSS-REFERENCE

This application is a continuation-in-part of U.S. patent application Ser. No. 15/965,116, filed on Apr. 27, 2018, issued as U.S. Pat. No. 11,791,299 entitled "Redistribution Layer (RDL) Layouts for Integrated Circuits," which application claims the benefit of U.S. Provisional Application No. 62/592,701, filed on Nov. 30, 2017, which applications are hereby incorporated herein by reference.

BACKGROUND

The continued improvement of semiconductor fabrication processes has allowed manufacturers and designers to create a smaller and a more powerful electronic device. Semiconductor device fabrication has progressed from a ten (10) micrometer (μm) semiconductor fabrication process that was reached around 1971 to a twenty-two (22) nanometer (nm) semiconductor fabrication process that was reached around 2012. The semiconductor device fabrication is expected to further progress onto a five (5) nm semiconductor fabrication process around 2019. With each progression of the semiconductor fabrication process, semiconductor elements in the integrated circuit components have become smaller to allow more components to be fabricated onto the semiconductor substrate. Multiple integrated circuit components may be bonded together to form even more powerful electronic devices. However, with each progression of the semiconductor fabrication process, new challenges in bonding integrated circuit components have been uncovered. One such new challenge relates to preventing pockets of air from forming between the integrated circuit components during bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
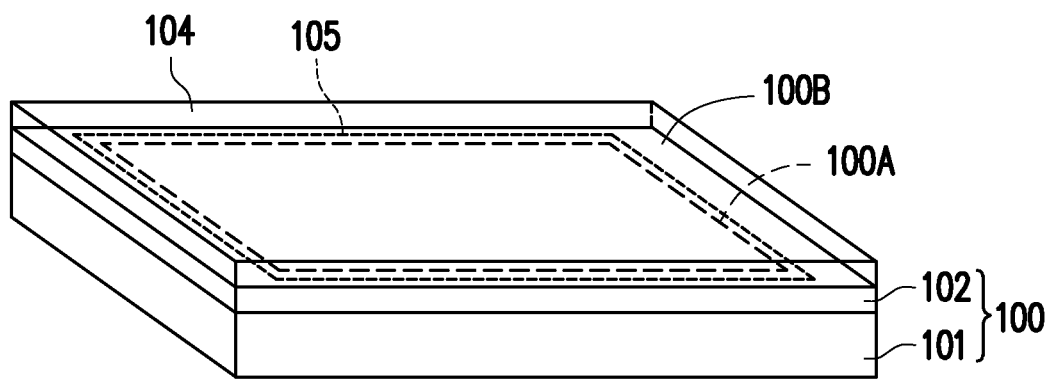
FIG. 1A and FIG. 1B respectively illustrate exemplary integrated circuit components and semiconductor devices including bonded integrated circuit components according to exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Exemplary embodiments for redistribution layers formed on integrated circuit components are disclosed. The redistribution layers on the integrated circuit components of the present disclosure include one or more arrays of conductive contacts that are configured and arranged to allow a bonding wave to displace air between the redistribution layers during bonding. This configuration and arrangement of the one or more arrays minimize discontinuities, such as pockets of air (i.e. voids) to provide an example, between the redistribution layers during the bonding.

Figure 1B:
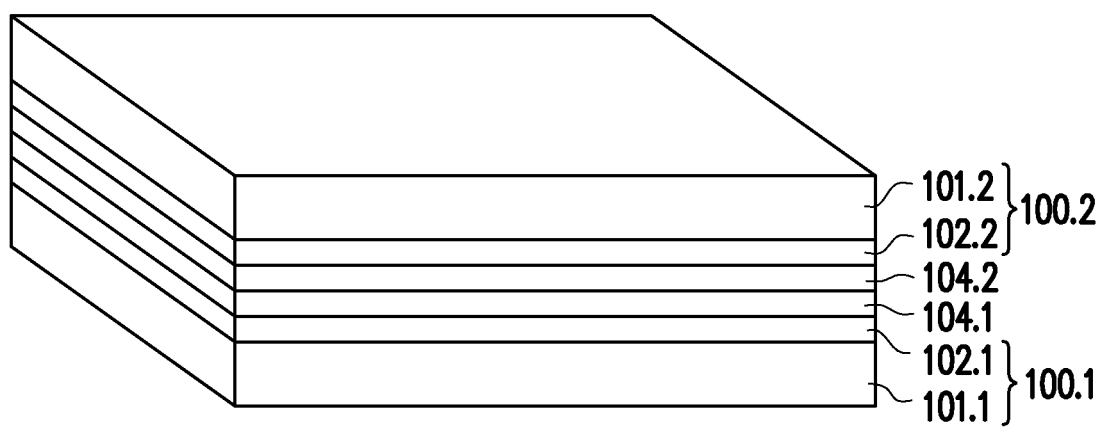

FIG. 1A and FIG. 1B respectively illustrate exemplary integrated circuit component and semiconductor device including bonded integrated circuit components according to exemplary embodiments of the present disclosure. As illustrated in FIG. 1A, an exemplary integrated circuit component 100 includes a semiconductor substrate 101 having electronic circuitry formed therein, and an interconnection structure 102 disposed on the semiconductor substrate 101. In some embodiments, the integrated circuit component 100 includes an active region 100A in which the electronic circuitry is formed and a periphery region 100B surrounding the active region 100A. A redistribution layer 104 is fabricated on the interconnection structure 102 of the integrated circuit component 100 in a back-end-of-line (BEOL) process. The redistribution layer 104 formed on the interconnection structure 102 of the integrated circuit component 100 may serve as a bonding layer when the integrated circuit component 100 is bonded with other components. In the exemplary embodiment illustrated in FIG. 1A, the electronic circuitry formed in the semiconductor substrate 101 includes analog and/or digital circuitry situated within a semiconductor stack having one or more conductive layers, also referred to as metal layers, interdigitated with one or more non-conductive layers, also referred to as insulation layers. However, one skilled in the relevant art(s) will recognize the electronic circuitry may include one or more mechanical and/or electromechanical devices without departing from the spirit and scope of the present disclosure.

The semiconductor substrate 101 may be made of silicon or other semiconductor materials. Alternatively, the semiconductor substrate 101 may include other elementary semiconductor materials such as germanium. In some embodiments, the semiconductor substrate 101 is made of a compound semiconductor such as sapphire, silicon carbide, gallium arsenic, indium arsenide, or indium phosphide. In some embodiments, the semiconductor substrate 101 is made of an alloy semiconductor such as silicon germanium, silicon germanium carbide, gallium arsenic phosphide, or gallium indium phosphide. In some embodiments, the semiconductor substrate 101 includes an epitaxial layer. For example, the semiconductor substrate 101 has an epitaxial layer overlying a bulk semiconductor.

The semiconductor substrate 101 may further include isolation features (not shown), such as shallow trench isolation (STI) features or local oxidation of silicon (LOCOS) features. Isolation features may define and isolate various semiconductor elements. The semiconductor substrate 101 may further include doped regions (not shown). The doped regions may be doped with p-type dopants, such as boron or $BF_2$, and/or n-type dopants, such as phosphorus (P) or arsenic (As). The doped regions may be formed directly on the semiconductor substrate 101, in a P-well structure, in an N-well structure, or in a dual-well structure.

The electronic circuitry including the above-mentioned isolation features and semiconductor elements (e.g., transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements) may be formed over the semiconductor substrate 101. Various processes may be performed to form the isolation features and semiconductor elements, such as deposition, etching, implantation, photolithography, annealing, and/or other applicable processes. In some embodiments, the electronic circuitry including the isolation features and semiconductor elements are formed in the semiconductor substrate 101 in a front-end-of-line (FEOL) process.

In some embodiments, the interconnection structure 102 includes dielectric layers, conductive vias embedded in the dielectric layers, and conductive wirings formed between the dielectric layers, wherein different layers of the conductive wirings are electrically connected to one another through the conductive vias. Furthermore, the interconnection structure 102 is electrically connected to the electronic circuitry formed in the semiconductor substrate 101. In some embodiments, at least one seal ring 105 and at least one alignment mark are formed in the interconnection structure 102, wherein the seal ring 105 and the alignment mark are formed within the periphery region 100B of the integrated circuit component 100, the seal ring 105 surrounds the active region 100A of the integrated circuit component 100, and the alignment mark is formed within a region out of the seal ring 105. In some embodiments, pluralities of alignment marks are formed around corners of the integrated circuit component 100. The number of the above-mentioned seal ring 105 and alignment mark(s) is not limited in this disclosure.

In the exemplary embodiment illustrated in FIG. 1A, the redistribution layer 104 represents a conductive layer (e.g., a metal layer) from among the one or more conductive layers of the semiconductor stack which is utilized for electrically coupling the electronic circuitry to other electrical, mechanical, and/or electromechanical devices. For example, the redistribution layer 104 may be used to electrically couple the electronic circuitry to an integrated circuit package, such as a through-hole package, a surface mount package, a pin grid array package, a flat package, a small outline package, a chip-scale package, and/or a ball grid array to provide some examples.

As another example and as illustrated in FIG. 1B, a semiconductor device includes a first integrated circuit component 100.1, a first redistribution layer 104.1, a second integrated circuit component 100.2 and a second redistribution layer 104.2, wherein the first redistribution layer 104.1 and the second redistribution layer 104.2 are between the first integrated circuit component 100.1 and the second integrated circuit component 100.2. An exemplary first integrated circuit component 100.1 includes a first semiconductor substrate 101.1 having first electronic circuitry formed therein, and a first interconnection structure 102.1 disposed on the first semiconductor substrate 101.1. An exemplary second integrated circuit component 100.2 includes a second semiconductor substrate 101.2 having second electronic circuitry formed therein, and a second interconnection structure 102.2 disposed on the semiconductor substrate 101.2. The first redistribution layer 104.1 from among a first semiconductor stack associated with first electronic circuitry may be electrically and/or mechanically coupled to the second redistribution layer 104.2 from among a second semiconductor stack associated with second electronic circuitry to electrically couple the first electronic circuitry and the second electronic circuitry. In this exemplary embodiment, the first redistribution layer 104.1 is configured and arranged to be electrically and/or mechanically coupled to the second redistribution layer 104.2. In an exemplary embodiment, the first redistribution layer 104.1 is bonded to the second redistribution layer 104.2 using hybrid bonding, direct bonding, surface activated bonding, plasma activated bonding, anodic bonding, eutectic bonding, thermo-compression bonding, reactive bonding, transient liquid phase diffusion bonding and/or any other well-known bonding technique which is apparent to those skilled in the relevant art(s) without departing from the spirit and scope of the present disclosure. In this exemplary embodiment, these afore-mentioned bonding techniques utilize a bonding wave to electrically and/or mechanically couple the first redistribution layer 104.1 and the second redistribution layer 104.2. As to be described in further detail below, the first redistribution layer 104.1 and the second redistribution layer 104.2 are configured and arranged to minimize discontinuities, such as pockets of air to provide an example, between the first redistribution layer 104.1 and the second redistribution layer 104.2 during the bonding of the first redistribution layer 104.1 and the second redistribution layer 104.2.

Figure 2A:
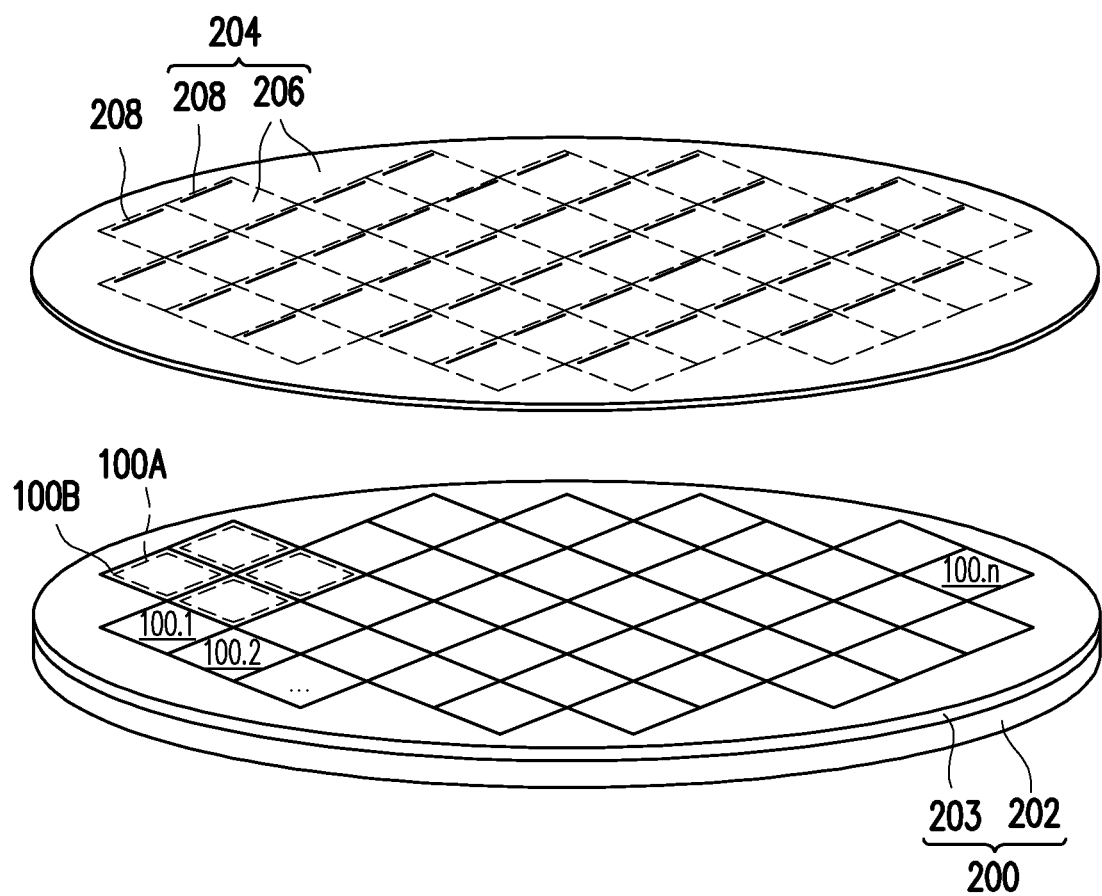
FIG. 2A, FIG. 2B and FIG. 2C illustrate exemplary semiconductor wafers including the exemplary integrated circuit components according to exemplary embodiments of the present disclosure.
Figure 2B:
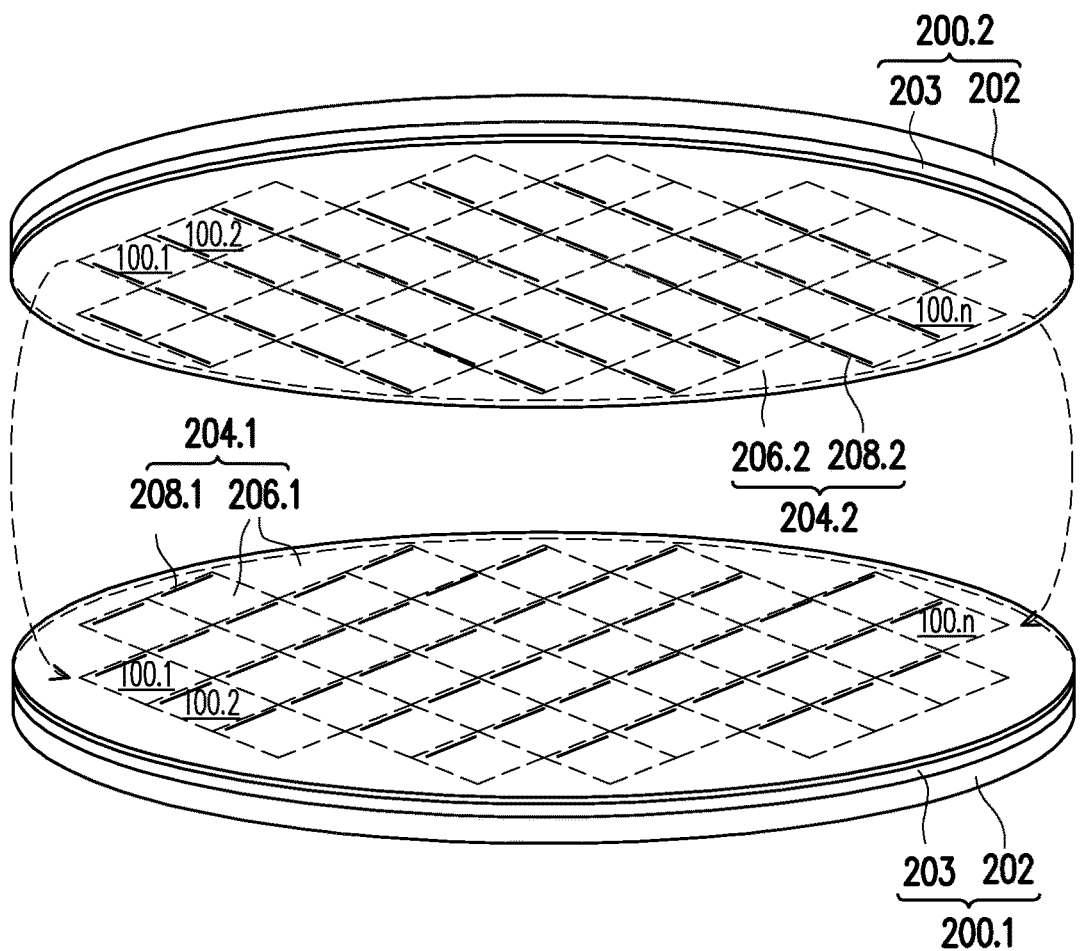
Figure 2C:
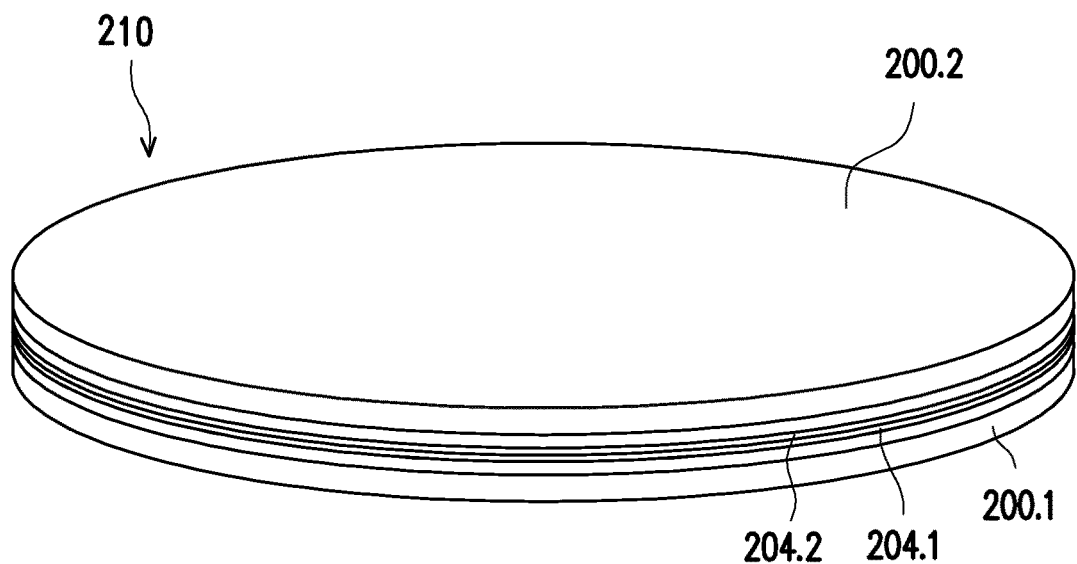

FIG. 2A, FIG. 2B and FIG. 2C illustrate exemplary semiconductor wafers including the exemplary integrated circuit components according to exemplary embodiments of the present disclosure. Referring to FIG. 2A, a semiconductor device fabrication operation is utilized to manufacture multiple integrated circuit components 100.1 through 100.$n$ in a semiconductor wafer 200. The semiconductor wafer 200 includes multiple integrated circuit components 100.1 through 100.$n$ arranged in array. In some embodiments, the semiconductor wafer 200 includes a semiconductor substrate 202 having electronic circuitry formed therein and an interconnection structure 203 disposed on the semiconductor substrate 202. In some embodiments, each one of the integrated circuit component 100.1 through 100.$n$ included in the semiconductor wafer 200 includes an active region 100A having electronic circuitry formed therein and a periphery region 100B surrounding the active region 100A. The semiconductor device fabrication operation uses a predetermined sequence of photographic and/or chemical processing operations to form the multiple integrated circuit components 100.1 through 100.$n$ in the first semiconductor wafer 200. The predetermined sequence of photographic and/or chemical processing operations may include deposition, removal, patterning, and modification. The deposition is an operation used to grow, coat, or otherwise transfer a material onto the semiconductor substrate and may include physical vapor deposition (PVD), chemical vapor deposition (CVD), electrochemical deposition (ECD), and/or molecular beam epitaxy (MBE) to provide some examples. The removal is an operation to remove material from the semiconductor substrate and may include wet etching, dry etching, and/or chemical-mechanical planarization (CMP) to provide some examples. The patterning, often referred to as lithography, is an operation to shape or alter material of the semiconductor substrate to form various geometric shapes of the analog and/or digital circuitry for the electronic device. The modification of electrical properties is an operation to alter physical, electrical, and/or chemical properties of material of the semiconductor substrate, typically, by ion implantation. In an exemplary embodiment, a semiconductor foundry may utilize this fabrication flow to fabricate the analog and/or digital circuitry for the electronic device on the semiconductor substrate.

In the exemplary embodiment illustrated in FIG. 2A, the integrated circuit components 100.1 through 100.n are formed in and/or on the semiconductor substrate 202 using a first series of fabrication operations, referred to as front-end-of-line processing, and a second series of fabrication operations, referred to as back-end-of-line processing. The front-end-of-line processing represents a first series of photographic and/or chemical processing operations to form corresponding electronic circuitry of the multiple integrated circuit components 100.1 through 100.n in and/or on the semiconductor substrate 202. The back-end-of-line processing represents a second series of photographic and/or chemical processing operations to form corresponding interconnection structure 203 of the multiple integrated circuit components 100.1 through 100.n on the semiconductor substrate 202 to form the semiconductor wafer 200. In an exemplary embodiment, the integrated circuit components 100.1 through 100.n included in the semiconductor wafer 200 may be similar and/or dissimilar to one other.

As shown in FIG. 2A, the semiconductor substrate 202 is a portion of the semiconductor wafer 200. The semiconductor substrate 202 may be made of silicon or other semiconductor materials. Additionally, the semiconductor substrate 202 may include other elementary semiconductor materials such as germanium. In some embodiments, the semiconductor substrate 202 is made of a compound semiconductor such as silicon carbide, gallium arsenic, indium arsenide, or indium phosphide. In some embodiments, the semiconductor substrate 202 is made of an alloy semiconductor such as sapphire, silicon germanium, silicon germanium carbide, gallium arsenic phosphide, or gallium indium phosphide. In some embodiments, the semiconductor substrate 202 includes an epitaxial layer. For example, the semiconductor substrate 202 has an epitaxial layer overlying a bulk semiconductor.

The semiconductor substrate 202 may further include isolation features (not shown), such as shallow trench isolation (STI) features or local oxidation of silicon (LOCOS) features. Isolation features may define and isolate various semiconductor elements. The semiconductor substrate 202 may further include doped regions (not shown). The doped regions may be doped with p-type dopants, such as boron or $BF_2$, and/or n-type dopants, such as phosphorus (P) or arsenic (As). The doped regions may be formed directly on the semiconductor substrate 202, in a P-well structure, in an N-well structure, or in a dual-well structure.

In some embodiments, the interconnection structure 203 includes dielectric layers, conductive vias embedded in the dielectric layers, and conductive wirings between the dielectric layers, wherein different layers of the conductive wirings are electrically connected to one another through the conductive vias.

A redistribution layer 204 is formed over the semiconductor wafer 200. In some embodiments, the process for fabricating the redistribution layer 204 over the semiconductor wafer 200 includes: forming a dielectric layer over the semiconductor wafer 200; patterning the dielectric layer to form a plurality of openings in the dielectric layer to expose conductive pads of the semiconductor wafer 200; depositing a conductive material over the semiconductor wafer 200 such that the dielectric layer and the conductive pads exposed by the openings in the dielectric layer are covered by the conductive material, wherein the conductive material not only covers the dielectric layer and the conductive pads, but also covers sidewall surfaces of the openings and completely fill the openings; performing a grinding process (e.g., CMP process) to partially remove an excess portion of conductive material until the top surface of the dielectric layer 206 is exposed so as to form arrays of conductive contacts 208 (e.g., metal vias and/or metal pads) in the dielectric layer 206. The redistribution layer 204 including the dielectric layer 206 and the arrays of conductive contacts 208 may serve as a bonding layer when a wafer level bonding process is performed to bond the semiconductor wafer 200 with another wafer.

As illustrated in FIG. 2B, a first semiconductor wafer 200.1 and a second semiconductor wafer 200.2 to be bonded with each other are provided. In some embodiments, two different types of wafers 200.1 and 200.2 are provided. In other words, the integrated circuit components 100.1 through 100.n included in first semiconductor wafer 200.1 and the integrated circuit components 100.1 through 100.n included in second semiconductor wafer 200.2 may have different architectures and perform different functions. For example, the first semiconductor wafer 200.1 is a sensor wafer including a plurality of image sensor chips (e.g., CMOS image sensor chips) and the second semiconductor wafer 200.2 is an application-specific integrated circuit (ASIC) wafer including a plurality of ASIC units corresponding to the image sensor chips. The image sensor chips included in the sensor wafer may be back-side illuminated CMOS image sensors (BSI-CIS) capable of sensing light from the back-surface of the CMOS image sensors, and the redistribution layer 204 may be formed over active surfaces (e.g., surfaces opposite to the back-surface of the CMOS image sensors) of the CMOS image sensors. In some alternative embodiments, two similar or same wafers 200.1 and 200.2 are provided. In other words, the integrated circuit components 100.1 through 100.n included in first semiconductor wafer 200.1 and the integrated circuit components 100.1 through 100.n included in second semiconductor wafer 200.2 may have the same or similar architecture and perform the same or similar function.

Before bonding the first semiconductor wafer 200.1 and the second semiconductor wafer 200.2, a first redistribution layer 204.1 and a second redistribution layer 204.2 are formed over the first semiconductor wafer 200.1 and the second semiconductor wafer 200.2 respectively. The process for forming the first redistribution layer 204.1 and the second redistribution layer 204.2 may be similar with the process for forming the redistribution layer 204 illustrated in FIG. 2A.

In some embodiments, the process for fabricating the first redistribution layer 204.1 over the first semiconductor wafer 200.1 includes: forming a first dielectric layer over the first semiconductor wafer 200.1; patterning the first dielectric layer to form a plurality of first openings in the first dielectric layer 206.1 to expose first conductive pads of the first semiconductor wafer 200.1; depositing a first conductive material over the first semiconductor wafer 200.1 such that the first dielectric layer 206.1 and the first conductive pads exposed by the first openings in the first dielectric layer 206.1 are covered by the first conductive material, wherein the first conductive material not only covers the first dielectric layer 206.1 and the first conductive pads, but also covers sidewall surfaces of the first openings and completely fill the first openings; performing a first grinding process (e.g., CMP process) to partially remove an excess portion of first conductive material until the top surface of the first dielectric layer 206.1 is exposed so as to form multiple arrays of conductive contacts 208.1 (e.g., metal vias and/or metal pads) in the first dielectric layer 206.1. In some embodiments, the process for fabricating the second redistribution layer 204.2 over the second semiconductor wafer 200.1 includes: forming a second dielectric layer 206.2 over the second semiconductor wafer 200.2; patterning the second dielectric layer 206.2 to form a plurality of second openings in the second dielectric layer 206.2 to expose second conductive pads of the second semiconductor wafer 200.2; depositing a second conductive material over the second semiconductor wafer 200.2 such that the second dielectric layer 206.2 and the second conductive pads exposed by the second openings are covered by the second conductive material, wherein the second conductive material not only covers the second dielectric layer 206.2 and the second conductive pads, but also covers sidewall surfaces of the second openings and completely fill the second openings; performing a second grinding process (e.g., CMP process) to partially remove an excess portion of second conductive material until the top surface of the second dielectric layer 206.2 is exposed so as to form multiple arrays of conductive contacts 208.2 (e.g., metal vias and/or metal pads) in the second dielectric layer 206.2.

In some embodiments, the arrays of conductive contacts 208.1 slightly protrude from the top surface of the first dielectric layer 206.1 and the arrays of conductive contacts 208.2 slightly protrude from the top surface of the second dielectric layer 206.2 because the first and dielectric layers 206.1 and 206.2 are polished at a relatively higher polishing rate while the conductive material is polished at a relatively lower polishing rate during the CMP processes.

As illustrated in FIG. 2B and FIG. 2C, after the first and second redistribution layers 204.1 and 204.2 are formed over the first and second semiconductor wafers 200.1 and 200.2, the first semiconductor wafer 200.1 having the first redistribution layer 204.1 formed thereon is flipped onto the second redistribution layer 204.2 formed on the second semiconductor wafer 200.2 such that the multiple arrays of conductive contacts 208.1 of the first redistribution layer 204.1 are substantially aligned with the multiple arrays of conductive contacts 208.2 of the second redistribution layer 204.2. Then, the first semiconductor wafer 200.1 is bonded to the second semiconductor wafer 200.2 through the first and second redistribution layers 204.1 and 204.2 to form a semiconductor device 210. In some embodiments, the bonding interface between the first redistribution layer 204.1 and the second redistribution layer 204.2 in the bonded structure (e.g., the semiconductor device) 210 is void free after performing the bonding process. This bonding may include hybrid bonding, direct bonding, surface activated bonding, plasma activated bonding, anodic bonding, eutectic bonding, thermo-compression bonding, reactive bonding, transient liquid phase diffusion bonding and/or any other well-known bonding technique which is apparent to those skilled in the relevant art(s) without departing from the spirit and scope of the present disclosure. As to be described in further detail below, the first redistribution layer 204.1 formed over the first semiconductor wafer 200.1 and the second redistribution layer 204.2 formed over the second semiconductor wafer 200.2 are configured and arranged to minimize discontinuities, such as pockets of air to provide an example, between the first redistribution layer 204.1 and the second redistribution layer 204.2.

Since the arrays of conductive contacts 208.1 slightly protrude from the top surface of the first dielectric layer 206.1 and the arrays of conductive contacts 208.2 slightly protrude from the top surface of the second dielectric layer 206.2, an air gap may be generated between the first and second redistribution layers 204.1 and 204.2 of the first and second semiconductor wafers 200.1 and 200.2. After aligning the multiple arrays of conductive contacts 208.1 and 208.2 on the first and second semiconductor wafers 200.1 and 200.2, a wafer-to-wafer hybrid bonding process may be performed such that the first and second semiconductor wafer 200.1 and 200.2 are physically and electrically bonded with each other. During the hybrid bonding process of the first and second semiconductor wafer 200.1 and 200.2, a bonding wave is applied to the first and second semiconductor wafer 200.1 and 200.2 to drive away air between the first and second redistribution layers 204.1 and 204.2.

It is noted that air may be trapped between the first and second redistribution layers 204.1 and 204.2 during the hybrid bonding process if the layout of the arrays of conductive contacts is not well configured and arranged. For example, when two most adjacent arrays of conductive contacts which extend parallel with each other are arranged too close, it is difficult to displace the air trapped between the two most adjacent arrays of conductive contacts, and accordingly, voids may be generated between the two most adjacent arrays of conductive contacts. In other words, voids may generate at the bonding interface between the first and second redistribution layers 204.1 and 204.2 and deteriorate device performance. In an exemplary embodiment, the arrays of conductive contacts are properly configured and arranged as illustrated in FIG. 4A through FIG. 4I to prevent voids from trapping at the bonding interface between the first and second redistribution layers 204.1 and 204.2.

In some embodiments, the above-mentioned hybrid bonding process of the first semiconductor wafer 200.1 and the second semiconductor wafer 200.2 includes simultaneously performed metal-to-metal bonding between conductive contacts 208.1 and 208.2 as well as dielectric-to-dielectric bonding between the first and second dielectric layers 206.1 and 206.2. For example, the metal-to-metal bonding between conductive contacts 208.1 and 208.2 includes via-to-via bonding, pad-to-pad bonding or via-to-pad bonding.

Figure 3A:
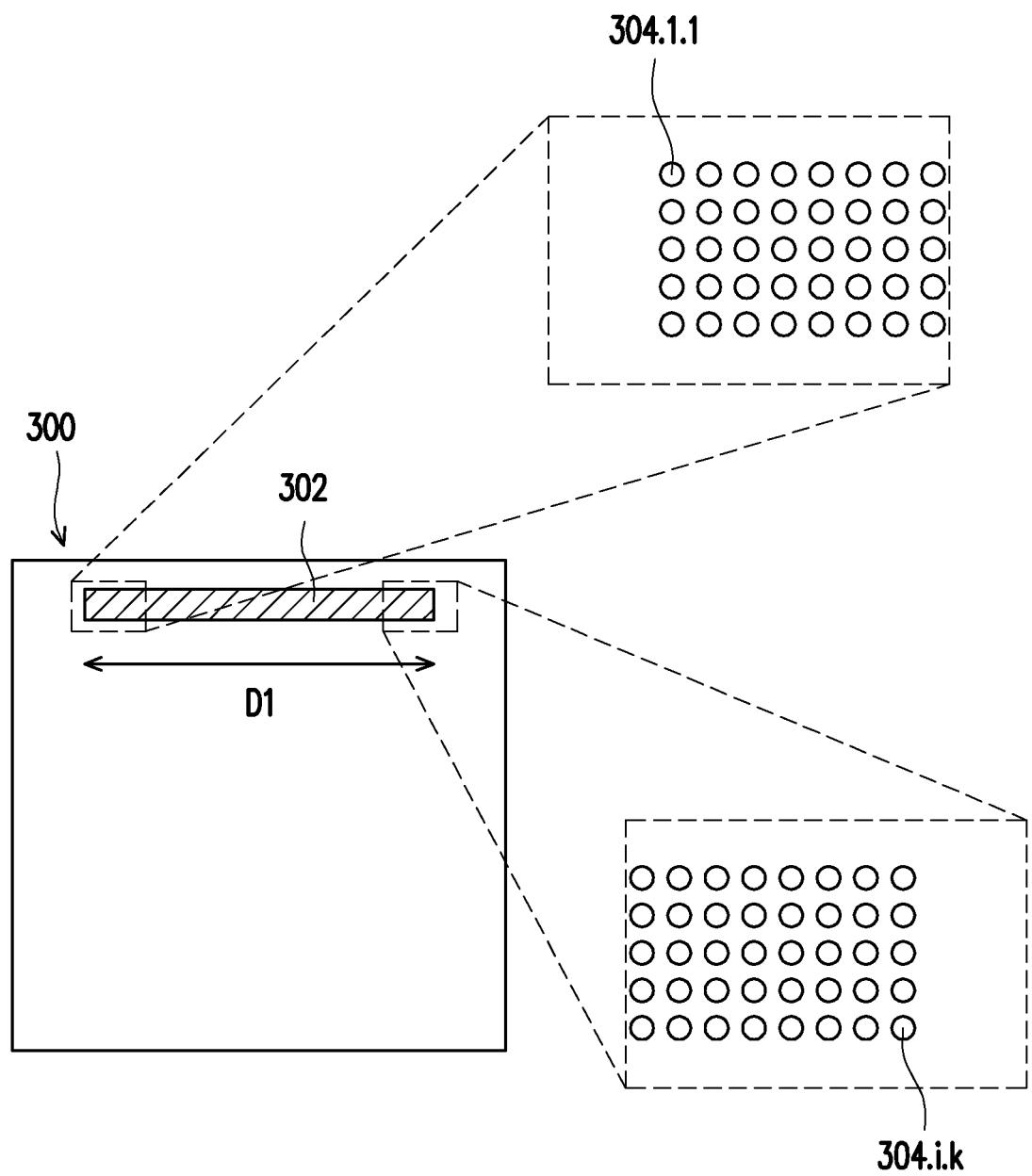
FIG. 3A through FIG. 3J illustrate exemplary redistribution layers of the exemplary integrated circuit components according to exemplary embodiments of the present disclosure.
Figure 3B:
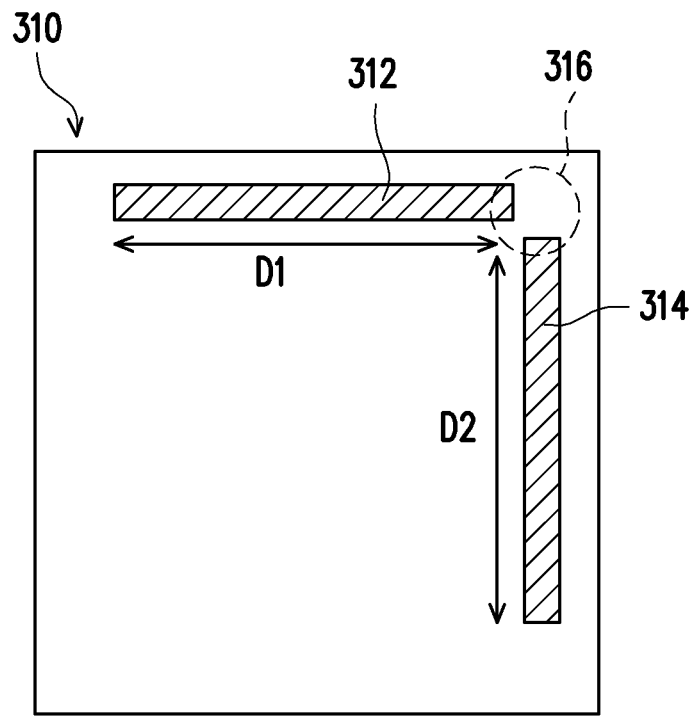
Figure 3C:
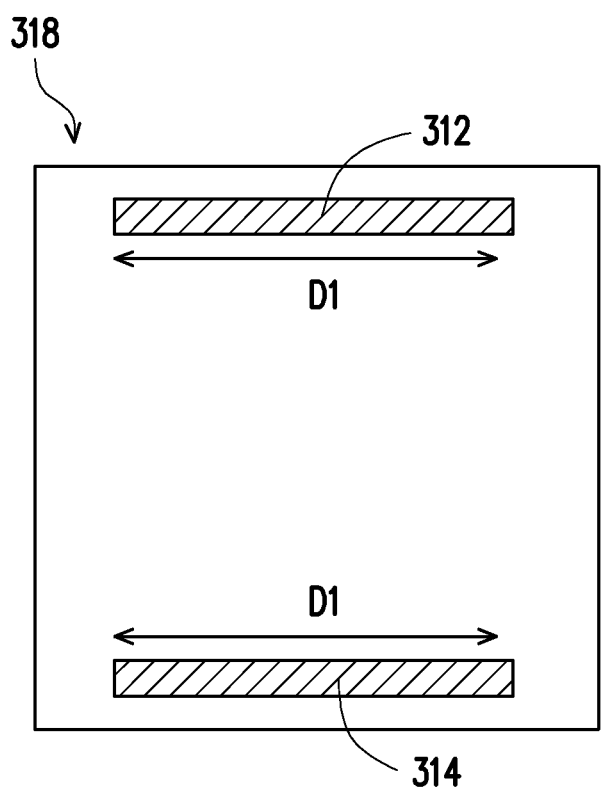
Figure 3D:
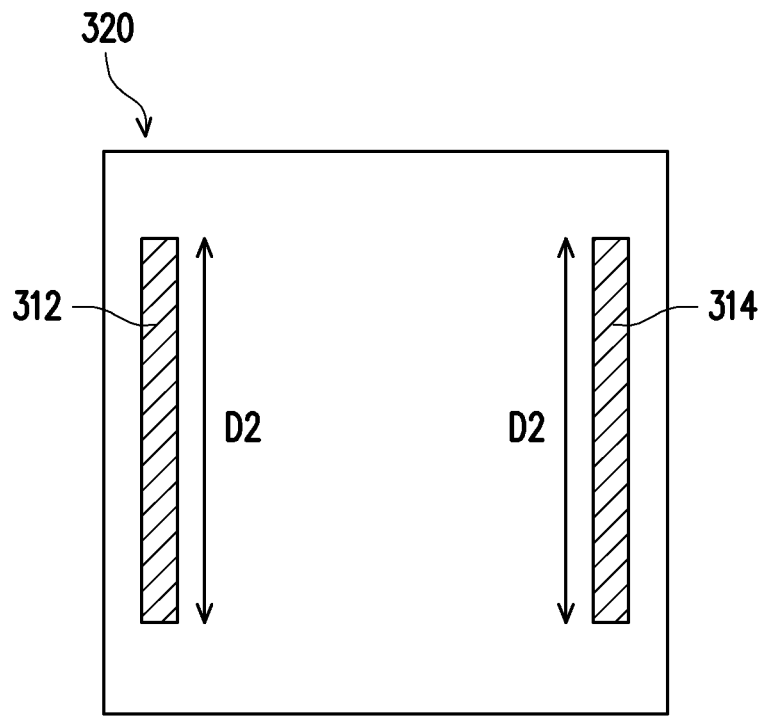
Figure 3E:
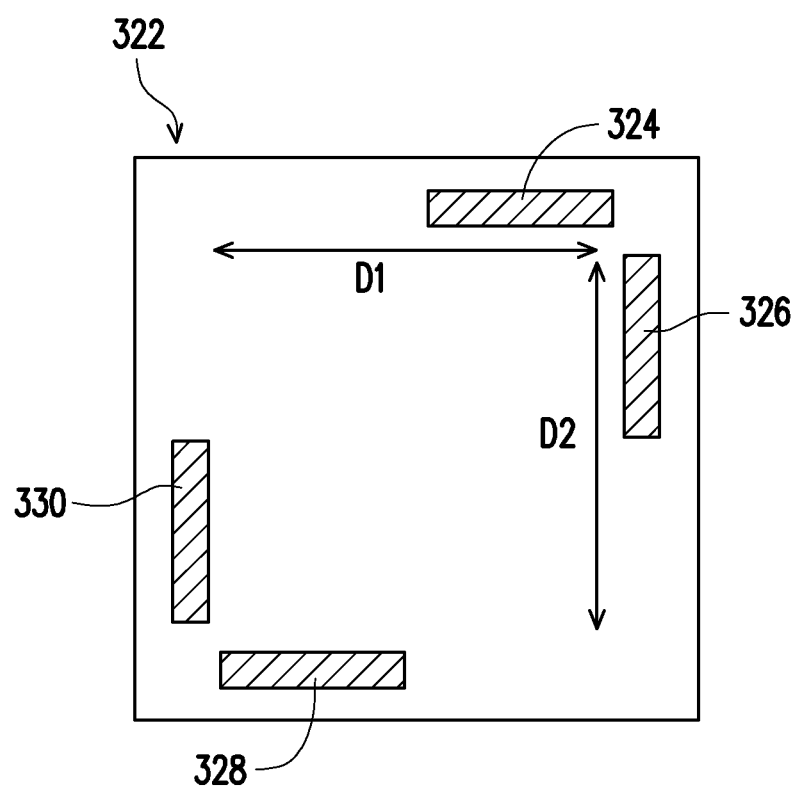
Figure 3F:
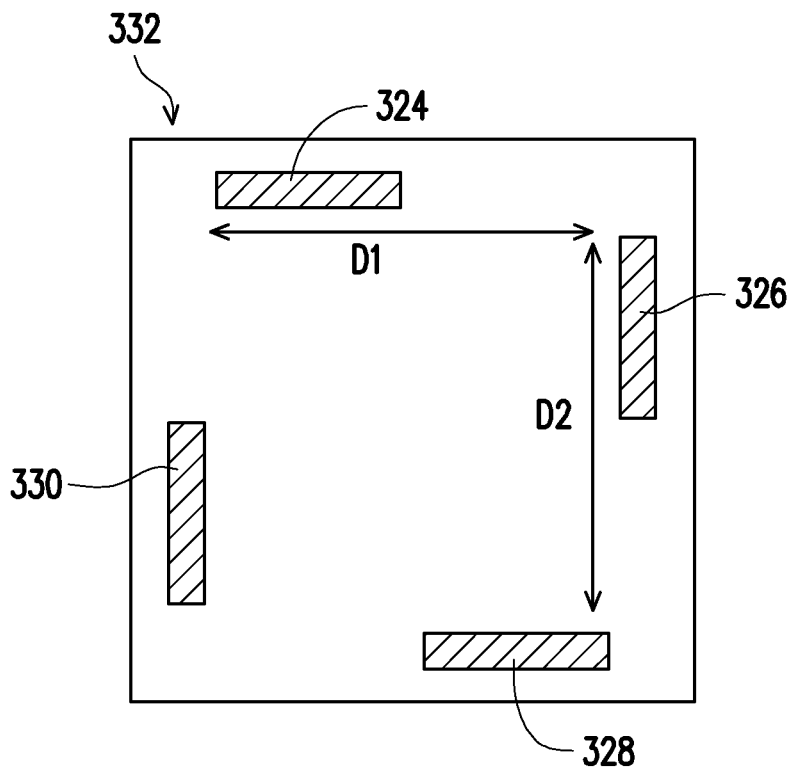
Figure 3G:
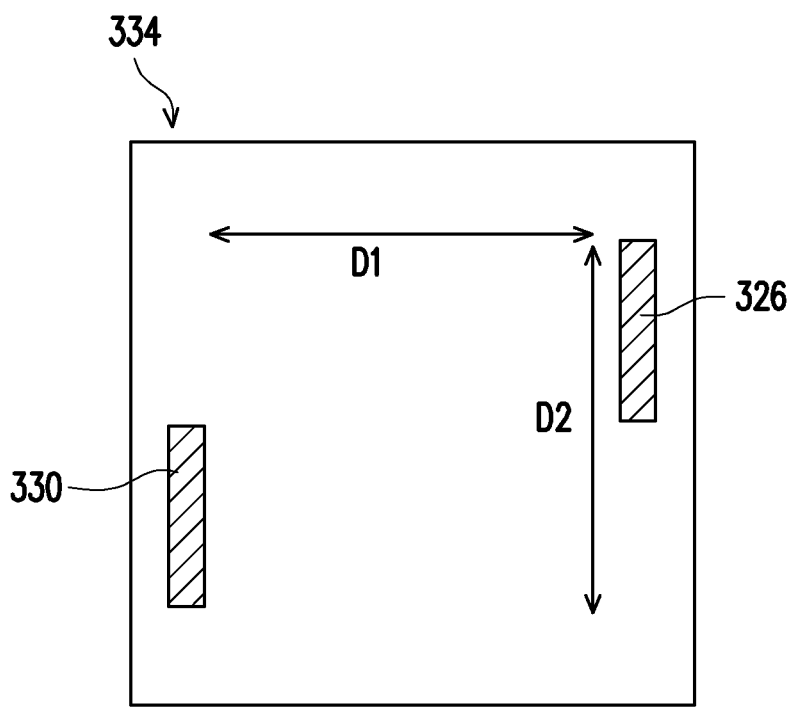
Figure 3H:
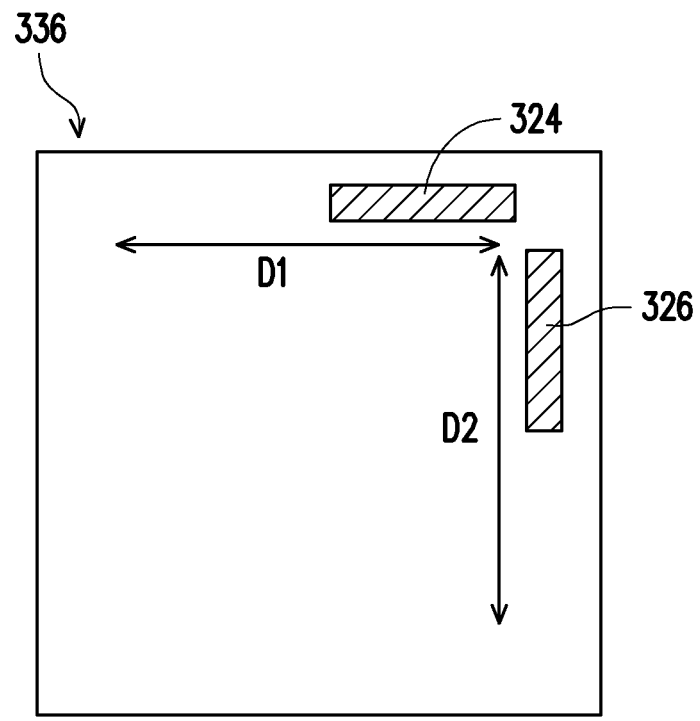
Figure 3I:
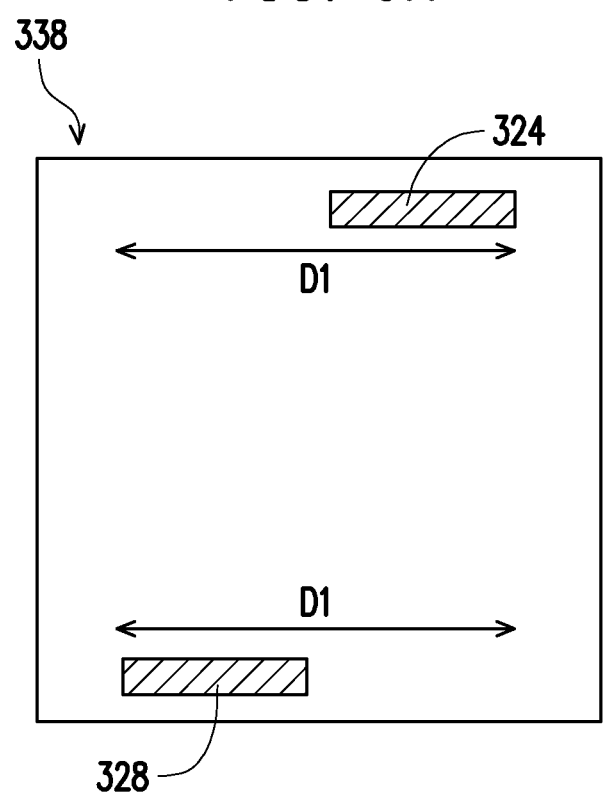
Figure 3J:
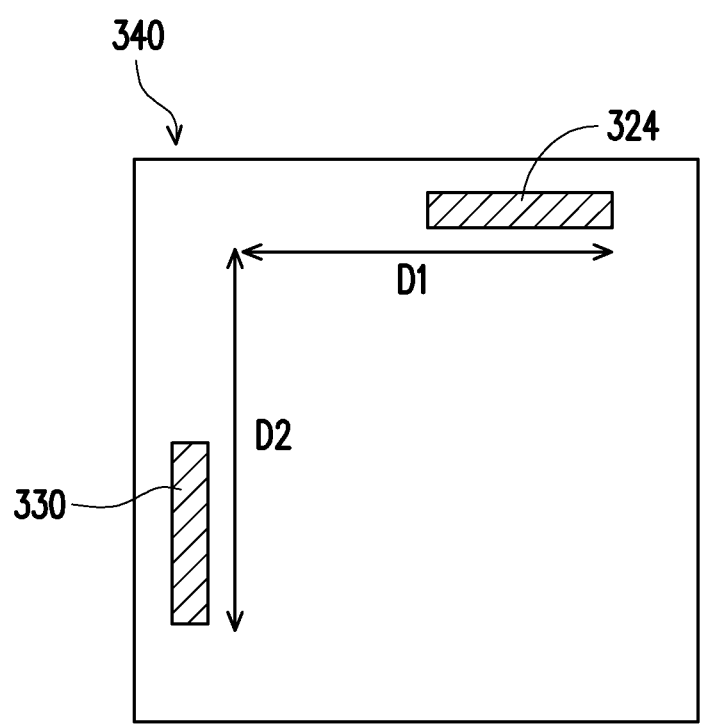

FIG. 3A through FIG. 3J illustrate exemplary redistribution layers of the exemplary integrated circuit components according to exemplary embodiments of the present disclosure. A redistribution layer 300 as illustrated in FIG. 3A, a redistribution layer 310 as illustrated in FIG. 3B, a redistribution layer 318 as illustrated in FIG. 3C, a redistribution layer 320 as illustrated in FIG. 3D, a redistribution layer 322 as illustrated in FIG. 3E, a redistribution layer 332 as illustrated in FIG. 3F, a redistribution layer 334 as illustrated in FIG. 3G, a redistribution layer 336 as illustrated in FIG. 3H, a redistribution layer 338 as illustrated in FIG. 3I, and a redistribution layer 340 as illustrated in FIG. 3J each represents a conductive layer from among one or more conductive layers of a semiconductor stack of an integrated circuit, such as the integrated circuit component 100 to provide an example. The redistribution layer 300, the redistribution layer 310, the redistribution layer 318, the redistribution layer 320, the redistribution layer 322, the redistribution layer 332, the redistribution layer 334, the redistribution layer 336, the redistribution layer 338, and/or the redistribution layer 340 may be utilized for electrically coupling the integrated circuit to other electrical, mechanical, and/or electromechanical devices. In the exemplary embodiment illustrated in FIG. 3A, the redistribution layer 300 includes an array of first conductive contacts 302. As illustrated in FIG. 3A, the array of first conductive contacts 302 extends along a first direction D1, such as an x-axis of a Cartesian coordinate system to provide an example, along a first side of the integrated circuit component. Those skilled in the relevant art(s) will recognize the array of first conductive contacts 302 may alternatively extend along a second direction D2, such as a y-axis of a Cartesian coordinate system to provide an example, along a second side of the redistribution layer 300 without departing from the spirit and scope of the present disclosure. In an exemplary embodiment, the array of first conductive contacts 302 includes conductive contacts 304.1.1 through 304.$i.k$ arranged in a series of i rows and k columns to form an array. In some embodiments, the arrangement pitch of the conductive contacts 304.1.1 through 304.$i.k$ ranges from about 3 micrometers to about 5 micrometers. The conductive contacts 304.1.1 through 304.$i.k$ may include one or more conductive materials such as tungsten (W), aluminum (Al), copper (Cu), gold (Au), silver (Ag), or platinum (Pt) to provide some examples. However, the conductive contacts 304.1.1 through 304.$i.k$ may alternatively, or additionally, include other materials, such as silicide, for example, nickel silicide (NiSi), sodium silicide ($Na_2Si$), magnesium silicide ($Mg_2Si$), platinum silicide (PtSi), titanium silicide ($TiSi_2$), tungsten silicide ($WSi_2$), or molybdenum disilicide ($MoSi_2$) to provide some examples, as will be recognize by those skilled in the relevant art(s) without departing from the spirit and scope of the present disclosure.

In the exemplary embodiment illustrated in FIG. 3A, the redistribution layer 300 may be bonded to other redistribution layers of other electrical, mechanical, and/or electromechanical devices using hybrid bonding, direct bonding, surface activated bonding, plasma activated bonding, anodic bonding, eutectic bonding, thermocompression bonding, reactive bonding, transient liquid phase diffusion bonding and/or any other well-known bonding technique which is apparent to those skilled in the relevant art(s) without departing from the spirit and scope of the present disclosure. In this exemplary embodiment, these bonding techniques listed above utilize a bonding wave to electrically and/or mechanically couple the redistribution layer 300 to other redistribution layers of other electrical, mechanical, and/or electromechanical devices. The configuration and arrangement of the array of conductive contacts 302 minimizes discontinuities, such as pockets of air to provide an example, between these redistribution layers. For example, the array of first conductive contacts 302 within the redistribution layer 300 allows the bonding wave to displace air between the redistribution layer 300 to other redistribution layers of other electrical, mechanical, and/or electromechanical devices during the bonding of these redistribution layers.

In the exemplary embodiment illustrated in FIG. 3B, the redistribution layer 310 includes an array of first conductive contacts 312 and an array of second conductive contacts 314. As illustrated in FIG. 3B, the array of first conductive contacts 312 extends along the first direction D1, such as the x-axis of the Cartesian coordinate system to provide an example, along a first side of the integrated circuit component and the array of second conductive contacts 314 extends along the second direction D2, such as a y-axis of the Cartesian coordinate system to provide an example, along a second side of the integrated circuit component. In an exemplary embodiment, the array of first conductive contacts 312 and the array of second conductive contacts 314 include conductive contacts that are configured and arranged in a substantially similar manner as the array of first conductive contacts 302 as described above in FIG. 3A. Those skilled in the relevant art(s) will recognize that other configurations and arrangements are possible for the array of first conductive contacts 312 and the array of second conductive contacts 314 without departing from the spirit and scope of the present disclosure. For example, the array of first conductive contacts 312 and the array of second conductive contacts 314 may extend along the first direction D1 along a first side and a third side, respectively, of the integrated circuit component as illustrated in FIG. 3C. As another example, the array of first conductive contacts 312 and the array of second conductive contacts 314 may extend along the second direction D2 along the second side and a fourth side, respectively, of the integrated circuit component as illustrated in FIG. 3D.

In the exemplary embodiment illustrated in FIG. 3B, the redistribution layer 310 may be bonded to other redistribution layers of other electrical, mechanical, and/or electromechanical devices in a substantially similar manner as the redistribution layer 300 as described above in FIG. 3B. In this exemplary embodiment, these bonding techniques listed above utilize a bonding wave to electrically and/or mechanically couple the redistribution layer 310 to other redistribution layers of other electrical, mechanical, and/or electromechanical devices. The configuration and arrangement of the array of first conductive contacts 312 and the array of second conductive contacts 314 minimize discontinuities, such as pockets of air to provide an example, between these redistribution layers. For example, the configuration and arrangement of the array of first conductive contacts 312 and the array of second conductive contacts 314 allows the bonding wave to displace air between the redistribution layer 310 and the other redistribution layers of other electrical, mechanical, and/or electromechanical devices during the bonding of these redistribution layers.

Additionally, in the exemplary embodiment illustrated in FIG. 3B, the redistribution layer 310 includes a separation, or exhaust pathway 316, between the array of first conductive contacts 312 and the array of second conductive contacts 314 to allow the air to be displaced during the bonding of the redistribution layer 310 and the other redistribution layers of other electrical, mechanical, and/or electromechanical devices during the bonding of these redistribution layers. In some situations, if the exhaust pathway 316 were not present, namely, the array of first conductive contacts 312 intersects or overlaps the array of second conductive contacts 314, one or more discontinuities may form approximate to an area within the redistribution layer 310 where the array of first conductive contacts 312 intersects the array of second conductive contacts 314. This intersection traps the air during the bonding of the redistribution layer 310 and the other redistribution layers of other electrical, mechanical, and/or electromechanical devices during the bonding of these redistribution layers forming the one or more discontinuities.

In the exemplary embodiment illustrated in FIG. 3E, the redistribution layer 322 includes an array of first conductive contacts 324, an array of second conductive contacts 326, an array of third conductive contacts 328, and an array of fourth conductive contacts 330. As illustrated in FIG. 3E, the array of first conductive contacts 324 and the array of third conductive contacts 328 extend along the first direction D1, such as the x-axis of the Cartesian coordinate system to provide an example, along a first side and a third side, respectively, of the integrated circuit component. The array of second conductive contacts 326 and the array of fourth conductive contacts 330 extend along the second direction D2, such as the y-axis of the Cartesian coordinate system to provide an example, along a second side and a fourth side, respectively, of the integrated circuit component. In an exemplary embodiment, lengths of the array of first conductive contacts 324 and the array of third conductive contacts 328 in the first direction D1 are less than one-half a length of the redistribution layer 322 in the first direction D1. Similarly, in this exemplary embodiment, lengths of the array of second conductive contacts 326 and the array of fourth conductive contacts 330 in the second direction D2 are less than one-half a length of the redistribution layer 322 in the second direction D2. In another exemplary embodiment, the array of first conductive contacts 324, the array of second conductive contacts 326, the array of third conductive contacts 328, and the array of fourth conductive contacts 330 include conductive contacts that are configured and arranged in a substantially similar manner as the array of first conductive contacts 302 as described above in FIG. 3A. Those skilled in the relevant art(s) will recognize that other configurations and arrangements are possible for the array of first conductive contacts 324, the array of second conductive contacts 326, the array of third conductive contacts 328, and the array of fourth conductive contacts 330 without departing from the spirit and scope of the present disclosure. For example, the array of first conductive contacts 324 and the array of third conductive contacts 328 may be mirrored along an axis of the second direction D2, namely the y-axis of the Cartesian coordinate system to provide an example, as illustrated in FIG. 3F. Moreover, those skilled in the relevant art(s) will recognize the redistribution layer 322 need not include all of the array of first conductive contacts 324, the array of second conductive contacts 326, the array of third conductive contacts 328, and the array of fourth conductive contacts 330 without departing from the spirit and scope of the present disclosure. For example, the redistribution layer 334 includes the array of second conductive contacts and the array of fourth conductive contacts 330 as illustrated in FIG. 3G. As another example, the redistribution layer 336 includes the array of first conductive contacts 324 extending along the first direction D1 and the array of second conductive contacts 326 extending along the second direction D2 as illustrated in FIG. 3H. As yet another example, the redistribution layer 338 includes the array of first conductive contacts 324 extending along the first direction D1 and the array of third conductive contacts 328 extending along the first direction D1 as illustrated in FIG. 3I. As yet another example, the redistribution layer 340 includes the array of first conductive contacts 324 extending along the first direction D1 and the array of fourth conductive contacts 330 extending along the second direction D2 as illustrated in FIG. 3J.

Furthermore, those skilled in the relevant arts will further recognize the redistribution layer 300 as illustrated in FIG. 3A, the redistribution layer 310 as illustrated in FIG. 3B, the redistribution layer 322 as illustrated in FIG. 3E, the redistribution layer 332 as illustrated in FIG. 3F, the redistribution layer 334 as illustrated in FIG. 3G, the redistribution layer 336 as illustrated in FIG. 3H, the redistribution layer 338 as illustrated in FIG. 3I, and/or the redistribution layer 340 as illustrated in FIG. 3J may be rotated, for example, by 90 degrees, 180 degrees, and/or 270 degrees, in a clockwise or counter-clockwise manner to form additional exemplary redistribution layers without departing from the spirit and scope of the present disclosure.

Figure 4A:
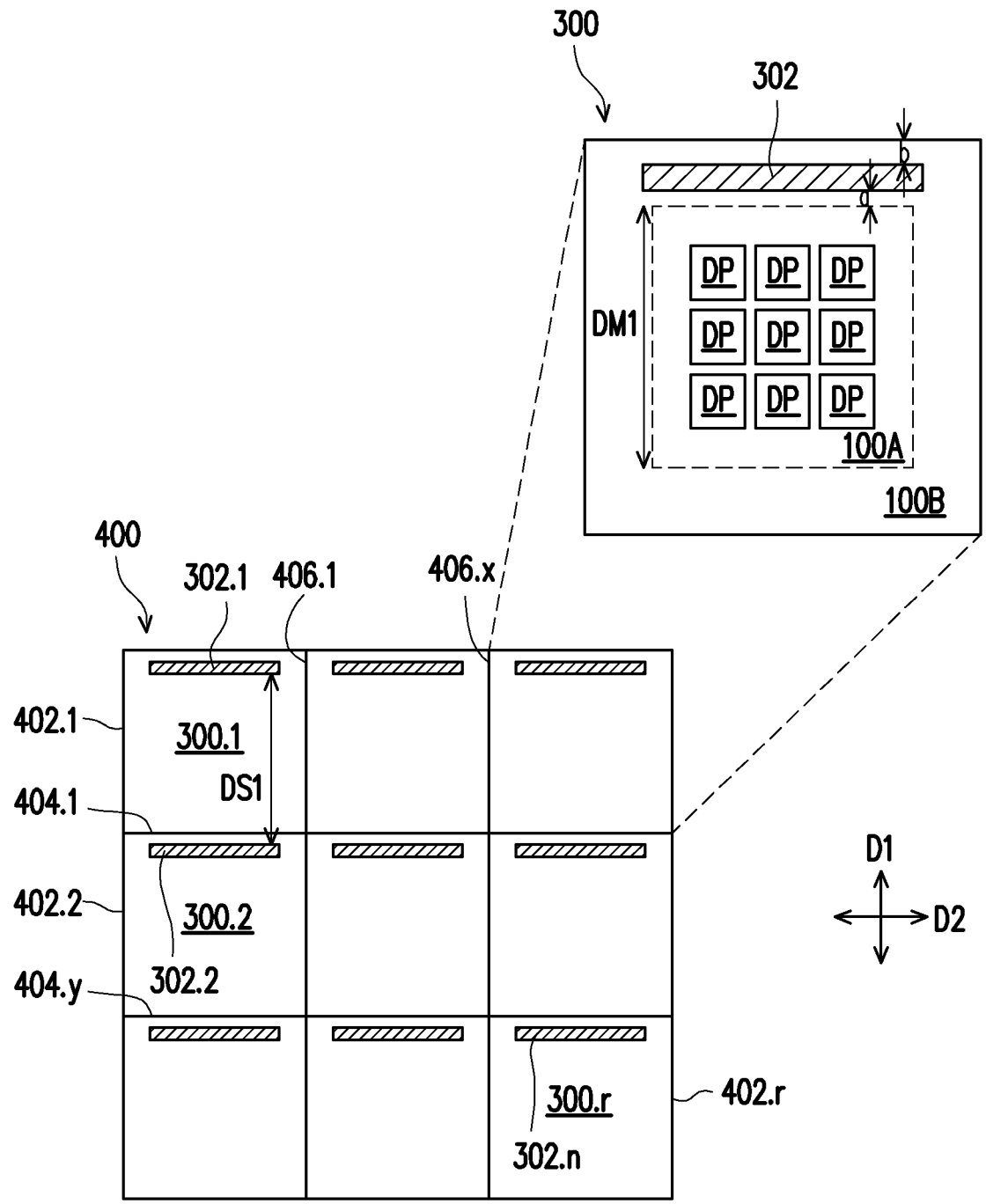
FIG. 4A through FIG. 4I illustrate exemplary redistribution layers for the exemplary semiconductor wafers according to exemplary embodiments of the present disclosure.
Figure 4B:
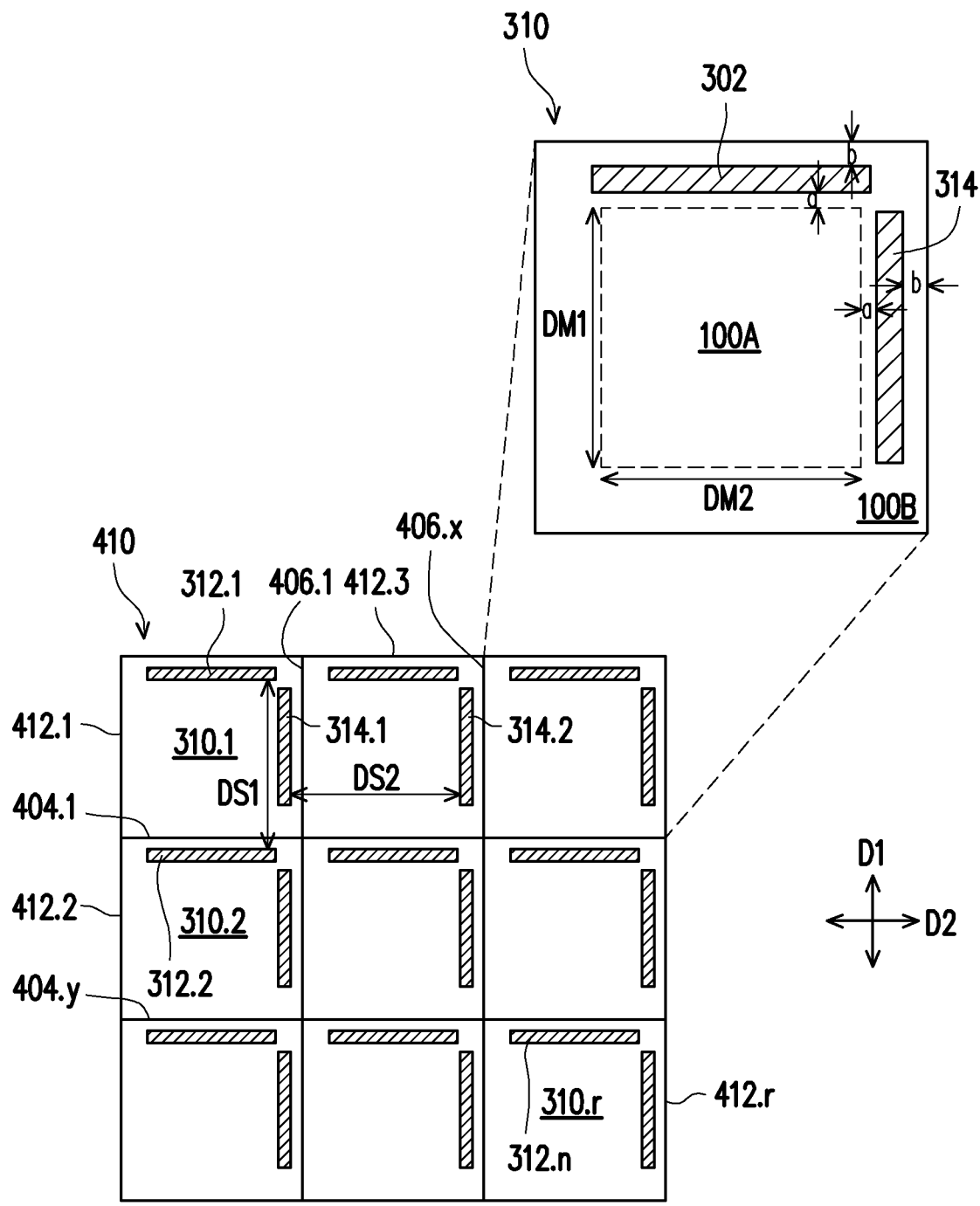
Figure 4C:
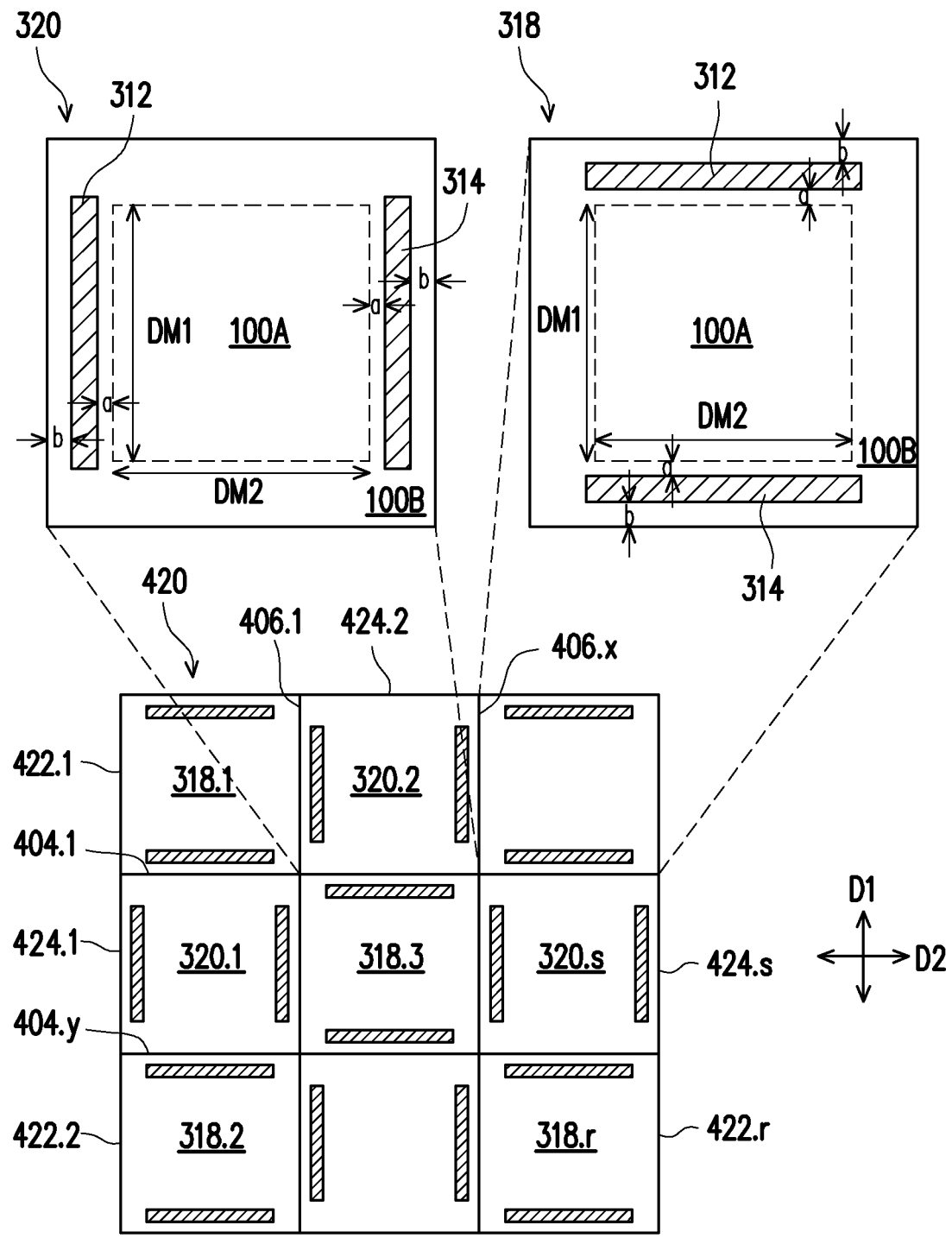
Figure 4D:
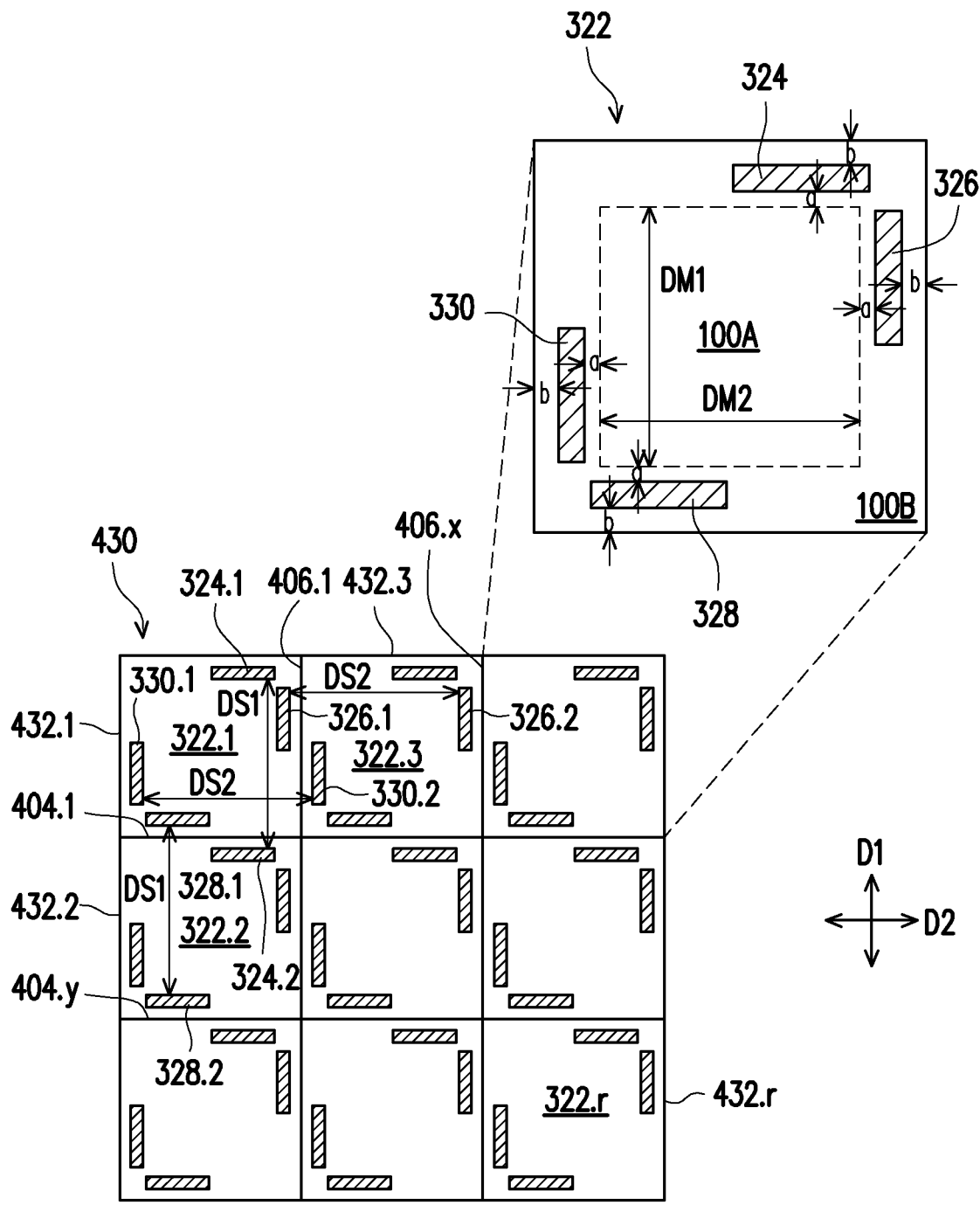
Figure 4E:
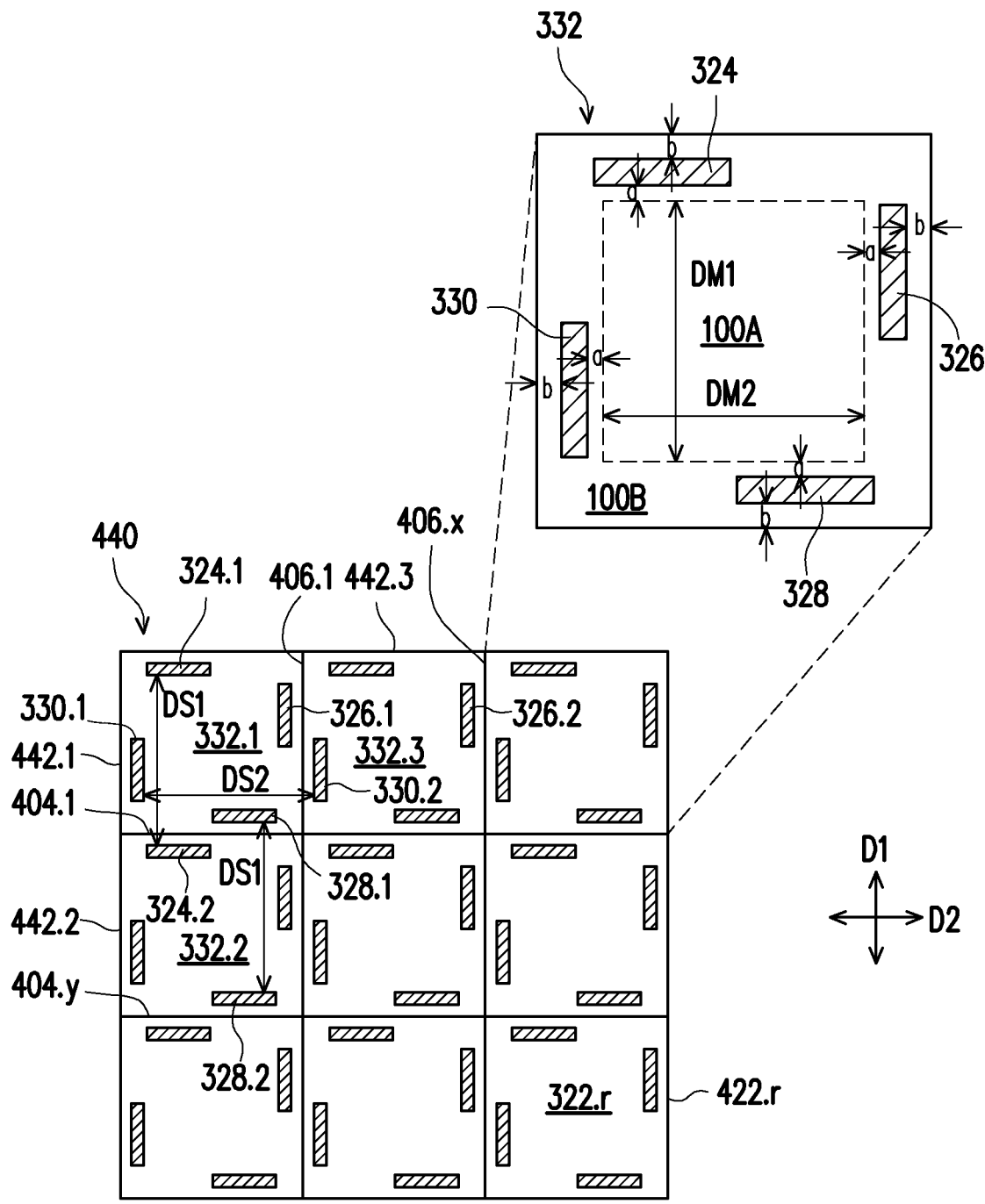
Figure 4F:
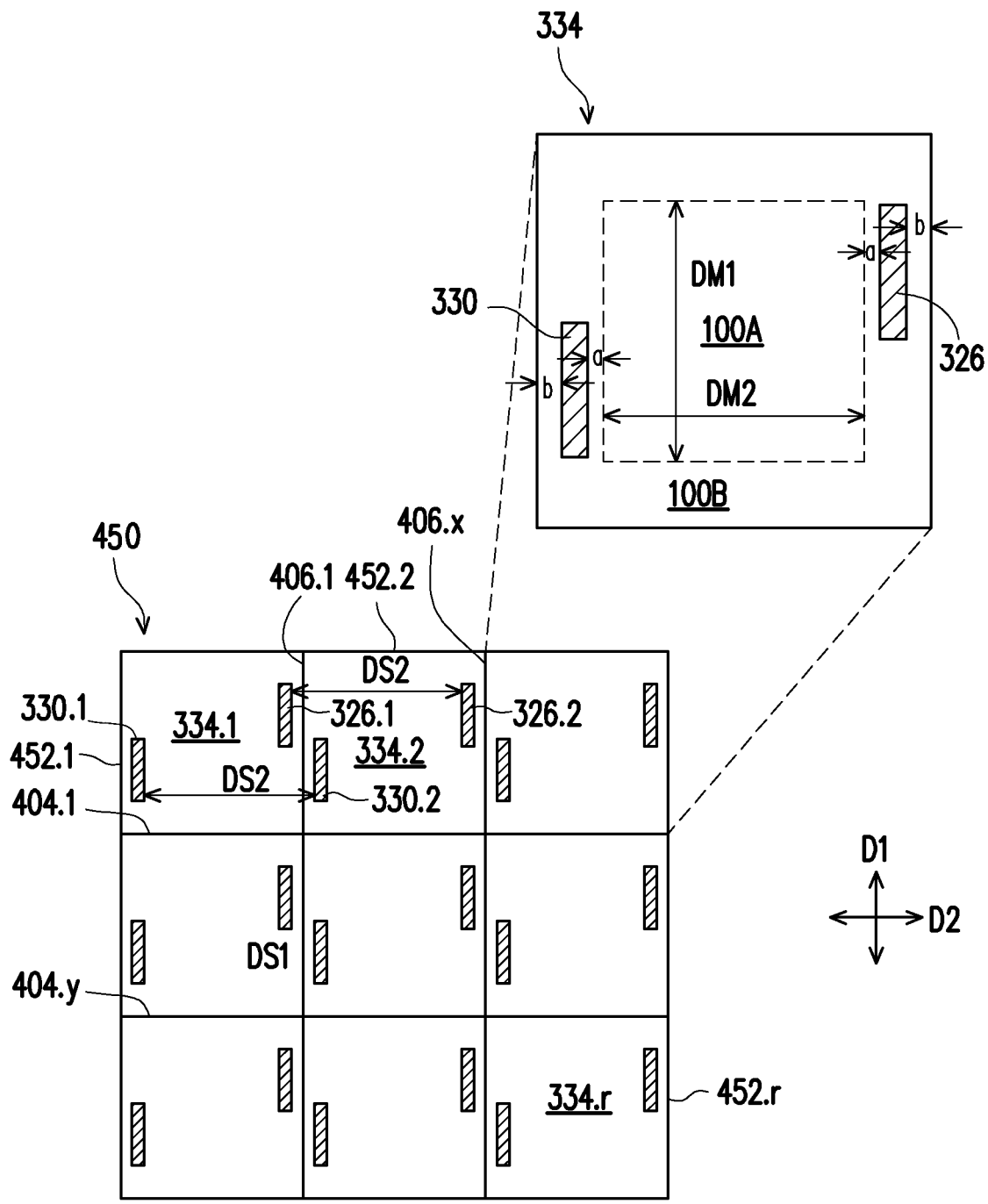
Figure 4G:
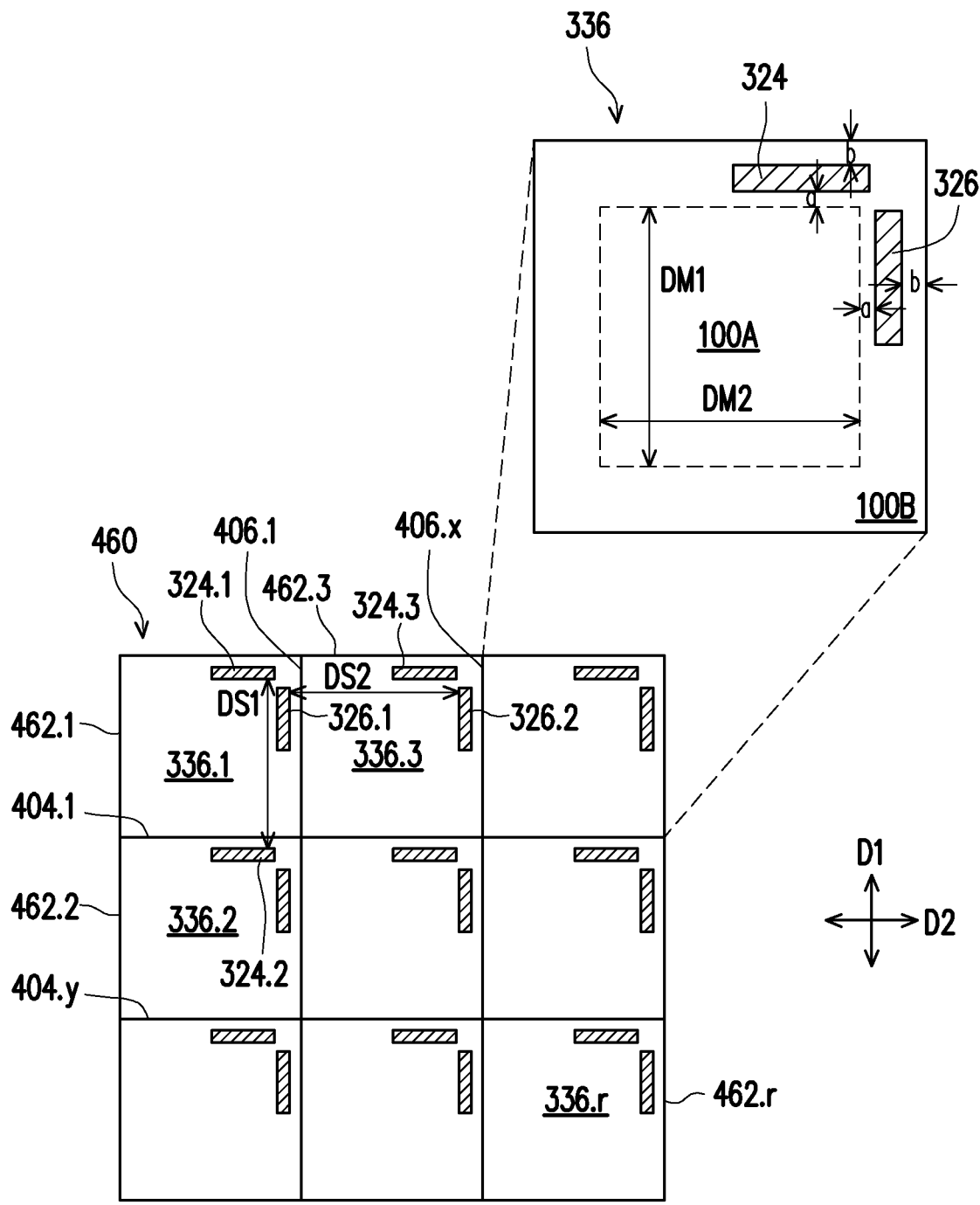
Figure 4H:
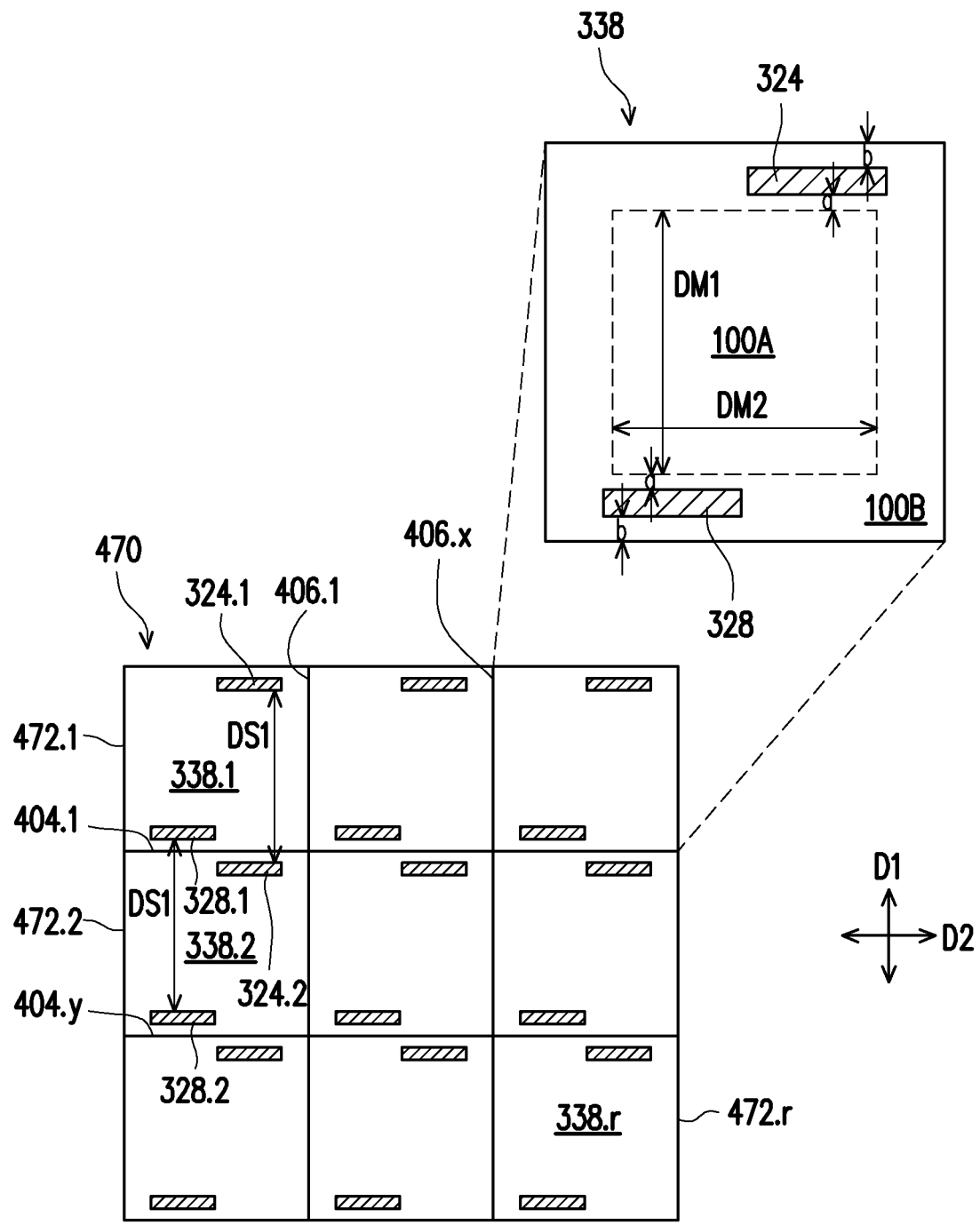
Figure 4I:
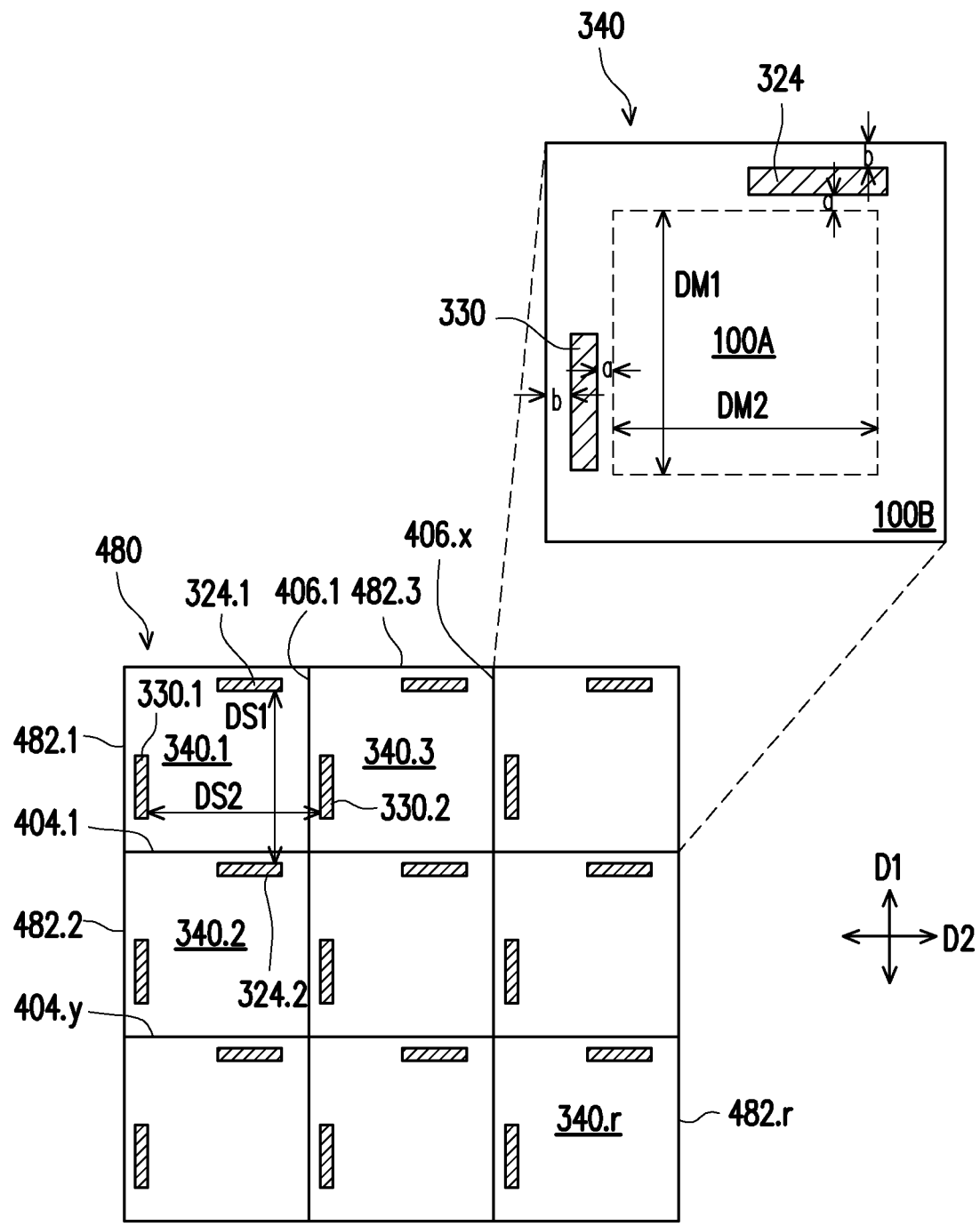

FIG. 4A through FIG. 4I illustrate exemplary semiconductor wafers having the exemplary redistribution layers according to exemplary embodiments of the present disclosure. A semiconductor wafer 400 as illustrated in FIG. 4A, a semiconductor wafer 410 as illustrated in FIG. 4B, a semiconductor wafer 420 as illustrated in FIG. 4C, a semiconductor wafer 430 as illustrated in FIG. 4D, a semiconductor wafer 440 as illustrated in FIG. 4E, a semiconductor wafer 450 as illustrated in FIG. 4F, a semiconductor wafer 460 as illustrated in FIG. 4G, a semiconductor wafer 470 as illustrated in FIG. 4H, and a semiconductor wafer 480 as illustrated in FIG. 4I each includes multiple integrated circuit components, such as the integrated circuit components 100.1 through 100.$n$ as described above in FIG. 2A. The multiple integrated circuit components 100.1 through 100.$n$ are covered by a redistribution layer including a plurality of redistribution patterns 300.1 through 300.$r$ and the plurality of redistribution patterns 300.1 through 300.$r$ are identical in layout. Each redistribution pattern 300.1, 300.2, . . . or 300.$r$ may has the same layout as the redistribution layer 300 as illustrated in FIG. 3A, the redistribution layer 310 as illustrated in FIG. 3B, the redistribution layer 322 as illustrated in FIG. 3E, the redistribution layer 332 as illustrated in FIG. 3F, the redistribution layer 334 as illustrated in FIG. 3G, the redistribution layer 336 as illustrated in FIG. 3H, the redistribution layer 338 as illustrated in FIG. 3I or the redistribution layer 340 as illustrated in FIG. 3J.

In the exemplary embodiment illustrated in FIG. 4A, the semiconductor wafer 400 includes integrated circuit components 402.1 through 402.$r$. As illustrated in FIG. 4A, the integrated circuit components 402.1 through 402.$r$ are respectively covered by the redistribution patterns 300.1 through 300.$r$ of the redistribution layer, each of the redistribution patterns 300.1 through 300.$r$ is identical with the redistribution layer 300 as described above in FIG. 3A. In the exemplary embodiment illustrated in FIG. 4A, the array of first conductive contacts 302 is separated or spaced apart from the active region 100A by a distance a. For example, the distance a ranges from about 60 micrometers to about 70 micrometers, such as approximately 65 micrometers. Similarly, the array of first conductive contacts 302 is separated or spaced apart from peripheries, or edges, of their corresponding redistribution patterns 310.1 through 310.$r$ by a distance b. For example, the distance b ranges from about 60 micrometers to about 70 micrometers, such as approximately 65 micrometers (μm). In an exemplary embodiment, the semiconductor wafer 400 includes scribe lines 404.1 through 404.$y$ and scribe lines 406.1 through 406.$x$ intersected with the scribe lines 404.1 through 404.$y$. In this exemplary embodiment, the semiconductor wafer 400 may be cut along the scribe lines 404.1 through 404.$y$ and the scribe lines 406.1 through 406.$x$ to singulate the semiconductor wafer 400 into a plurality of singulated integrated circuit components 402.1 through 402.$r$. In the exemplary embodiment illustrated in FIG. 4A, at most one of the array of first conductive contacts 302 corresponding to one of the redistribution patterns 300.1 through 300.$r$ is adjacent to the scribe lines 404.1 through 404.$y$ at any location within the semiconductor wafer 400. For example, as illustrated in FIG. 4A, the array of first conductive contacts 302 corresponding to the redistribution pattern 300.2 disposed over the integrated circuit component 402.2 is along the scribe line 404.1 between the integrated circuit component 402.1 and the integrated circuit component 402.2. This configuration and arrangement of the redistribution patterns 300.1 through 300.r facilitates displacement of air during bonding of the semiconductor wafer 400 and other redistribution layers of other electrical, mechanical, and/or electromechanical devices during the bonding of these redistribution layers.

As illustrated in FIG. 4A, any two most adjacent arrays of first conductive contacts 302 (e.g., a first array of first conductive contacts 302.1 and a second array of first conductive contacts 302.2) which are aligned with each other in the second direction D2 and respectively disposed over two adjacent first integrated circuit components (e.g., the integrated circuit components 402.1 and 402.2) are apart from each other by a first distance DS1, the first distance DS1 is greater than a first dimension DM1 of the active region 100A in the second direction D2.

As shown in FIG. 4A, the first integrated circuit component 402.1 is most adjacent to the second integrated circuit component 402.2 in the second direction D2 substantially perpendicular with the first direction D1. The first array of first conductive contacts 302.1 are disposed on the periphery region 100B of the first integrated circuit component 402.1 while the second array of first conductive contacts 302.2 are disposed on the periphery region 100B of the second integrated circuit component 402.2. The first and second arrays of first conductive contacts 302.1 and 302.2 extend along the first direction D1 and are substantially aligned with each other in the second direction D2. Furthermore, the first and second arrays of first conductive contacts 302.1 and 302.2 are apart from each other by a first distance DS1 in the second direction D2.

As shown in FIG. 4A, in some embodiments, the first array of first conductive contacts 302.1 and the second array of first conductive contacts 302.2 are substantially aligned with each other in the second direction D2 and no other array of conductive contacts is arranged between the first array of first conductive contacts 302.1 and the second array of first conductive contacts 302.2.

In some alternative embodiments, each of the redistribution patterns 300.1 through 300.r further includes a dummy pattern DP (e.g., dummy metal pattern) embedded in the dielectric layer, wherein the dummy pattern DP is electrically floating and are arranged between any two most adjacent arrays of first conductive contacts 302. For example, the dummy pattern DP includes at least one dummy metal pad or a plurality of dummy metal vias arranged in an array. The dummy pattern DP is apart from the arrays of first conductive contacts 302 to make sure that air is not trapped between the dummy pattern DP and the arrays of first conductive contacts 302. For example, the dummy pattern DP is embedded in the dielectric layer of the redistribution patterns 300.1 through 300.r and located above the active regions 100A and/or the periphery regions 100B of the integrated circuit components 402.1 through 402.r. It is noted that a metal ratio of the redistribution patterns 300.1 through 300.r may affect the process window and yields of the CMP process for fabricating the arrays of first conductive contacts 302 because of loading effect. Thickness uniformity of the arrays of first conductive contacts 302 may be affected by loading effect when the metal ratio of the redistribution patterns 300.1 through 300.r is low. Accordingly, the dummy pattern DP may improve the process window and yields of the CMP process for fabricating the arrays of first conductive contacts 302.

In the exemplary embodiment illustrated in FIG. 4B, the semiconductor wafer 410 includes integrated circuit components 412.1 through 412.r. As illustrated in FIG. 4B, the integrated circuit components 402.1 through 412.r are respectively covered by the redistribution patterns 310.1 through 310.r of the redistribution layer, each of the redistribution patterns 310.1 through 310.r is identical with the redistribution layer 310 as described above in FIG. 3B. In the exemplary embodiment illustrated in FIG. 4B, the array of first conductive contacts 312 and the array of second conductive contacts 314 are separated or spaced apart from the active region 100A by a distance a. For example, the distance a ranges from about 60 micrometers to about 70 micrometers, such as approximately 65 micrometers. Similarly, the array of first conductive contacts 312 and the array of second conductive contacts 314 are separated or spaced apart from peripheries, or edges, of their corresponding redistribution patterns 310.1 through 310.r by a distance b. For example, the distance b ranges from about 60 micrometers to about 70 micrometers, such as approximately 65 micrometers (μm). In an exemplary embodiment, the semiconductor wafer 410 includes the horizontal rows of scribe lines 404.1 through 404.y and the vertical columns of scribe lines 406.1 through 406.x as described above in FIG. 4A. In the exemplary embodiment illustrated in FIG. 4B, at most one of the array of first conductive contacts 312 corresponding to one of the redistribution patterns 310.1 through 310.r is adjacent to the horizontal rows of scribe lines 404.1 through 404.y at any location within the semiconductor wafer 410 and at most one of the array of second conductive contacts 314 corresponding to one of the redistribution patterns 310.1 through 310.r is adjacent to the vertical columns of scribe lines 406.1 through 406.x at any location within the semiconductor wafer 410. For example, as illustrated in FIG. 4B, the array of first conductive contacts 312 corresponding to the redistribution pattern 310.2 disposed over the integrated circuit component 412.2 is along the horizontal row of scribe line 404.1 between the integrated circuit component 412.1 and the integrated circuit component 412.2. As another example, as illustrated in FIG. 4B, the array of second conductive contacts 314 corresponding to the redistribution pattern 310.1 disposed over the integrated circuit component 412.1 is along the vertical row of scribe lines 406.1 between the integrated circuit component 412.1 and the integrated circuit component 412.3. This configuration and arrangement of the redistribution patterns 310.1 through 310.r facilitates displacement of air during bonding of the semiconductor wafer 410 and other redistribution layers of other electrical, mechanical, and/or electromechanical devices during the bonding of these redistribution layers.

As illustrated in FIG. 4B, any two most adjacent arrays of first conductive contacts 312 (e.g., a first array of first conductive contacts 312.1 and a second array of first conductive contacts 312.2) which are aligned with each other in the second direction D2 and respectively disposed over two adjacent integrated circuit components (e.g., the integrated circuit components 412.1 and 412.2) are apart from each other by a first distance DS1, and the first distance DS1 is greater than a first dimension DM1 of the active region 100A in the second direction D2. In addition, any two most adjacent arrays of second conductive contacts 314 (e.g., a first array of second conductive contacts 314.1 and a second array of second conductive contacts 314.2) which are aligned with each other in the first direction D1 and respectively disposed over two adjacent integrated circuit components (e.g., the integrated circuit components 412.1 and 412.3) are apart from each other by a second distance DS2, and the second distance DS2 is greater than a second dimension DM2 of the active region 100A in the first direction D1.

As shown in FIG. 4B, the first integrated circuit component 412.1 is most adjacent to the second integrated circuit component 412.2 in the second direction D2. The first array of first conductive contacts 312.1 are disposed on the periphery region 100B of the first integrated circuit component 412.1 while the second array of first conductive contacts 312.2 are disposed on the periphery region 100B of the second integrated circuit component 412.2. The first and second arrays of first conductive contacts 312.1 and 312.2 extend along the first direction D1 and are substantially aligned with each other in the second direction D2. Furthermore, the first and second arrays of first conductive contacts 312.1 and 312.2 are apart from each other by the second distance DS1 in the second direction D2.

In some embodiments, the first array of first conductive contacts 312.1 and the second array of first conductive contacts 312.2 are substantially aligned with each other in the second direction D2 and no other array of conductive contacts is arranged between the first array of first conductive contacts 312.1 and the second array of first conductive contacts 312.2.

As shown in FIG. 4B, the first integrated circuit component 412.1 is most adjacent to the third integrated circuit component 412.3 in the first direction D1. The first array of second conductive contacts 314.1 are disposed on the periphery region 100B of the first integrated circuit component 412.1 while the second array of second conductive contacts 314.2 are disposed on the periphery region 100B of the third integrated circuit component 412.3. The first and second arrays of second conductive contacts 314.1 and 314.2 extend along the second direction D2 and are substantially aligned with each other in the first direction D1. Furthermore, the first and second arrays of second conductive contacts 314.1 and 314.2 are apart from each other by the second distance DS2 in the first direction D1.

In some embodiments, the first array of second conductive contacts 314.1 and the second array of second conductive contacts 314.2 are substantially aligned with each other in the first direction D1 and no other array of conductive contacts is arranged between the first array of second conductive contacts 314.1 and the second array of second conductive contacts 314.2.

In some alternative embodiments, each of the redistribution patterns 310.1 through 310.r further includes a dummy pattern (e.g., dummy metal pattern as shown in FIG. 4A) embedded in the dielectric layer, wherein the dummy pattern is electrically floating and are arranged between the arrays of first conductive contacts 312 and/or 314. For example, the dummy pattern includes at least one dummy metal pad or a plurality of dummy metal vias arranged in an array. The dummy pattern is apart from the arrays of first conductive contacts 312 and/or 314 to make sure that air is not trapped between the dummy pattern and the arrays of first conductive contacts 312 and/or 314. For example, the dummy pattern is embedded in the dielectric layer of the redistribution patterns 310.1 through 310.r and located above the active regions 100A and/or the periphery regions 100B of the integrated circuit components 412.1 through 412.r. It is noted that metal ratio of the redistribution patterns 310.1 through 310.r may affect the process window and yields of the CMP process for fabricating the arrays of first conductive contacts 312 and 314 because of loading effect. Thickness uniformity of the arrays of first conductive contacts 312 and 314 may be affected by loading effect when the metal ratio of the redistribution patterns 310.1 through 310.r is low. Accordingly, the dummy pattern may improve the process window and yields of the CMP process for fabricating the arrays of first conductive contacts 312 and 314.

In the exemplary embodiment illustrated in FIG. 4C, the semiconductor wafer 420 includes integrated circuit components 422.1 through 422.r interdigitated with integrated circuit components 424.1 through 424.s. As illustrated in FIG. 4C, the integrated circuit components 422.1 through 422.r are respectively covered by the redistribution patterns 318.1 through 318.r, each of the redistribution patterns 318.1 through 318.r is identical with the redistribution layer 318 as described above in FIG. 3C. The integrated circuit components 424.1 through 424.s are respectively covered by the redistribution patterns 320.1 through 320.s, each of the redistribution patterns 320.1 through 320.s is identical with the redistribution layer 320 as described above in FIG. 3D. As illustrated in FIG. 4C, the redistribution patterns 318.1 through 318.r and the redistribution patterns 320.1 through 320.s are configured and arranged to optimize displacement of air during bonding of the semiconductor wafer 420 and other redistribution layers of other electrical, mechanical, and/or electromechanical devices. In the exemplary embodiment illustrated in FIG. 4C, the first array of conductive contacts 312 of the redistribution patterns 318.1 through 318.r are situated along first sides, for example top sides, of the redistribution patterns 318.1 through 318.r and the second array of conductive contacts 314 of the redistribution patterns 318.1 through 318.r are situated along third sides, for example bottom sides, of the redistribution patterns 318.1 through 318.r. Also in the exemplary embodiment illustrated in FIG. 4C, the first array of conductive contacts 312 of the redistribution patterns 320.1 through 320.s are situated along second sides, for example right sides, of the redistribution patterns 320.1 through 320.s and the second array of conductive contacts 314 of the redistribution patterns 320.1 through 320.s are situated along fourth sides, for example left sides, of the redistribution patterns 320.1 through 320.s.

In an exemplary embodiment, the semiconductor wafer 420 includes the horizontal rows of scribe lines 404.1 through 404.y and/or the vertical columns of scribe lines 406.1 through 406.x as described above in FIG. 4A. In the exemplary embodiment illustrated in FIG. 4C, at most one of the first array of conductive contacts 312 and/or the second array of conductive contacts 314 corresponding to one of the redistribution patterns 318.1 through 318.r is adjacent to the horizontal rows of scribe lines 404.1 through 404.y at any location within the semiconductor wafer 410 and at most one of the first array of conductive contacts 312 and/or the second array of conductive contacts 314 corresponding to one of the redistribution patterns 320.1 through 320.s is adjacent to the vertical columns of scribe lines 406.1 through 406.x at any location within the semiconductor wafer 410. For example, as illustrated in FIG. 4C, the second array of conductive contacts 314 corresponding to the redistribution pattern 318.1 on the integrated circuit component 422.1 is along the horizontal row of scribe line 404.1 between the integrated circuit component 422.1 and the integrated circuit component 424.1. As another example, as illustrated in FIG. 4C, the first array of conductive contacts 312 corresponding to the redistribution pattern 320.1 on the integrated circuit component 424.2 is along the vertical row of scribe lines 406.1 between the integrated circuit component 422.1 and the integrated circuit component 424.2. This configuration and arrangement of the redistribution patterns 320.1 through 320.r facilitates displacement of air during bonding of the semiconductor wafer 410 and other redistribution layers of other electrical, mechanical, and/or electromechanical devices during the bonding of these redistribution layers. Furthermore, the above-mentioned dummy pattern (e.g., dummy metal pattern as shown in FIG. 4A) may be applied in the embodiment as illustrated FIG. 4C.

As illustrated in FIG. 4D, the semiconductor wafer 430 includes redistribution patterns 322.1 through 322.r, each of the redistribution patterns 322.1 through 322.r is identical with the redistribution layer 322 as described above in FIG. 3E. In the exemplary embodiment illustrated in FIG. 4D, the array of first conductive contacts 324, the array of second conductive contacts 326, the array of third conductive contacts 328, and the array of fourth conductive contacts 330 are separated or spaced apart from the active region 100A by a distance a. For example, the distance a ranges from about 60 micrometers to about 70 micrometers, such as approximately 65 micrometers. Similarly, the array of first conductive contacts 324, the array of second conductive contacts 326, the array of third conductive contacts 328, and the array of fourth conductive contacts 330 are separated or spaced apart from peripheries, or edges, of their corresponding redistribution patterns 322.1 through 322.r by a distance b. For example, the distance b ranges from about 60 micrometers to about 70 micrometers, such as approximately 65 micrometers (μm).

In an exemplary embodiment, the semiconductor wafer 430 includes the horizontal rows of scribe lines 404.1 through 404.y and/or the vertical columns of scribe lines 406.1 through 406.x as described above in FIG. 4A. In the exemplary embodiment illustrated in FIG. 4D, at most one of the array of first conductive contacts 324 and the array of third conductive contacts 328 corresponding to one of the redistribution patterns 322.1 through 322.r is adjacent to the horizontal rows of scribe lines 404.1 through 404.y at any location within the semiconductor wafer 430 and at most one of the array of second conductive contacts 326 and the array of fourth conductive contacts 330 corresponding to one of the redistribution patterns 322.1 through 322.r is adjacent to the vertical columns of scribe lines 406.1 through 406.x at any location within the semiconductor wafer 430. For example, as illustrated in FIG. 4D, the third array of conductive contacts 328 corresponding to the redistribution pattern 322.1 of the integrated circuit component 432.1 is along a first portion of the horizontal row of scribe line 404.1 between the integrated circuit component 432.1 and the integrated circuit component 432.2 and the array of first conductive contacts 324 corresponding to the redistribution pattern 322.2 of the integrated circuit component 432.2 is along a second portion of the horizontal row of scribe line 404.1 between the integrated circuit component 432.1 and the integrated circuit component 432.2. As another example, as illustrated in FIG. 4D, the array of second conductive contacts 326 corresponding to the redistribution pattern 322.1 of the integrated circuit component 432.1 is along a first portion of the vertical column of scribe line 406.1 between the integrated circuit component 432.1 and the integrated circuit component 432.3 and the array of fourth conductive contacts 330 corresponding to the redistribution pattern 322.3 of the integrated circuit component 432.3 is along a second portion of the vertical column of scribe line 406.1 between the integrated circuit component 432.1 and the integrated circuit component 432.3. This configuration and arrangement of the redistribution patterns 322.1 through 322.r facilitates displacement of air during bonding of the semiconductor wafer 430 and other redistribution layers of other electrical, mechanical, and/or electromechanical devices during the bonding of these redistribution layers.

As illustrated in FIG. 4D, any two most adjacent arrays of first conductive contacts 324 (e.g., a first array of first conductive contacts 324.1 and a second array of first conductive contacts 324.2) which are aligned with each other in the second direction D2 and respectively disposed over two adjacent integrated circuit components (e.g., the integrated circuit components 432.1 and 432.2) are apart from each other by a first distance DS1, and the first distance DS1 is greater than a first dimension DM1 of the active region 100A in the second direction D2. Any two most adjacent arrays of second conductive contacts 326 (e.g., a first array of second conductive contacts 326.1 and a second array of second conductive contacts 326.2) which are aligned with each other in the first direction D1 and respectively disposed over two adjacent integrated circuit components (e.g., the integrated circuit components 432.1 and 432.3) are apart from each other by a second distance DS2, and the second distance DS2 is greater than a second dimension DM2 of the active region 100A in the first direction D1. Any two most adjacent arrays of third conductive contacts 328 (e.g., a first array of third conductive contacts 328.1 and a second array of third conductive contacts 328.2) which are aligned with each other in the second direction D2 and respectively disposed over two adjacent integrated circuit components (e.g., the integrated circuit components 432.1 and 432.2) are apart from each other by the first distance DS1, and the first distance DS1 is greater than the first dimension DM1 of the active region 100A in the second direction D2. In addition, any two most adjacent arrays of fourth conductive contacts 330 (e.g., a first array of fourth conductive contacts 330.1 and a second array of fourth conductive contacts 330.2) which are aligned with each other in the first direction D1 and respectively disposed over two adjacent integrated circuit components (e.g., the integrated circuit components 432.1 and 432.3) are apart from each other by the second distance DS2, and the second distance DS2 is greater than the second dimension DM2 of the active region 100A in the first direction D1.

As shown in FIG. 4D, the first integrated circuit component 432.1 is most adjacent to the second integrated circuit component 432.2 in the second direction D2. The first array of first conductive contacts 324.1 are disposed on the periphery region 100B of the first integrated circuit component 432.1 while the second array of first conductive contacts 324.2 are disposed on the periphery region 100B of the second integrated circuit component 432.2. The first and second arrays of first conductive contacts 324.1 and 324.2 extend along the first direction D1 and are substantially aligned with each other in the second direction D2. The first and second arrays of first conductive contacts 324.1 and 324.2 are apart from each other by the second distance DS1 in the second direction D2. Similarly, the first array of third conductive contacts 328.1 are disposed on the periphery region 100B of the first integrated circuit component 432.1 while the second array of third conductive contacts 328.2 are disposed on the periphery region 100B of the second integrated circuit component 432.2. The first and second arrays of third conductive contacts 328.1 and 328.2 extend along the first direction D1 and are substantially aligned with each other in the second direction D2. The first and second arrays of third conductive contacts 328.1 and 328.2 are apart from each other by the second distance DS1 in the second direction D2. Furthermore, the first and second arrays of first conductive contacts 324.1 and 324.2 are not aligned with the first and second arrays of third conductive contacts 328.1 and 328.2 in the second direction D2.

As shown in FIG. 4D, the first integrated circuit component 432.1 is most adjacent to the third integrated circuit component 432.3 in the first direction D1. The first array of second conductive contacts 326.1 are disposed on the periphery region 100B of the first integrated circuit component 432.1 while the second array of second conductive contacts 326.2 are disposed on the periphery region 100B of the third integrated circuit component 432.3. The first and second arrays of second conductive contacts 326.1 and 326.2 extend along the second direction D2 and are substantially aligned with each other in the first direction D1. Furthermore, the first and second arrays of second conductive contacts 326.1 and 326.2 are apart from each other by the second distance DS2 in the first direction D1. Similarly, the first array of fourth conductive contacts 330.1 are disposed on the periphery region 100B of the first integrated circuit component 432.1 while the second array of fourth conductive contacts 330.2 are disposed on the periphery region 100B of the third integrated circuit component 432.3. The first and second arrays of fourth conductive contacts 330.1 and 330.2 extend along the second direction D2 and are substantially aligned with each other in the first direction D1. The first and second arrays of fourth conductive contacts 330.1 and 330.2 are apart from each other by the second distance DS2 in the first direction D1. Furthermore, the first and second arrays of second conductive contacts 326.1 and 326.2 are not aligned with the first and second arrays of fourth conductive contacts 330.1 and 330.2 in the first direction D1.

In some embodiments, the first array of first conductive contacts 324.1 and the second array of first conductive contacts 324.2 are substantially aligned with each other in the second direction D2 and no other array of conductive contacts is arranged between the first array of first conductive contacts 324.1 and the second array of first conductive contacts 324.2. In some embodiments, the first array of second conductive contacts 326.1 and the second array of second conductive contacts 326.2 are substantially aligned with each other in the first direction D1 and no other array of conductive contacts is arranged between the first array of second conductive contacts 326.1 and the second array of second conductive contacts 326.2. In some embodiments, the first array of third conductive contacts 328.1 and the second array of third conductive contacts 328.2 are substantially aligned with each other in the second direction D2 and no other array of conductive contacts is arranged between the first array of third conductive contacts 328.1 and the second array of third conductive contacts 328.2. Similarly, the first array of fourth conductive contacts 330.1 and the second array of fourth conductive contacts 330.2 are substantially aligned with each other in the first direction D1 and no other array of conductive contacts is arranged between the first array of fourth conductive contacts 330.1 and the second array of fourth conductive contacts 330.2.

In some alternative embodiments, each of the redistribution patterns 322.1 through 322.$r$ further includes a dummy pattern (e.g., dummy metal pattern as shown in FIG. 4A) embedded in the dielectric layer, wherein the dummy pattern is electrically floating and are arranged between the arrays of first conductive contacts 324, 326, 328 and/or 330. The dummy pattern is apart from the arrays of first conductive contacts 324, 326, 328 and/or 330 to make sure that air is not trapped between the dummy pattern and the arrays of first conductive contacts 324, 326, 328 and/or 330. For example, the dummy pattern is embedded in the dielectric layer of the redistribution patterns 322.1 through 322.$r$ and located above the active regions 100A and/or the periphery regions 100B of the integrated circuit components 432.1 through 432.$r$. It is noted that a metal ratio of the redistribution patterns 322.1 through 322.$r$ may affect the process window and yields of the CMP process for fabricating the arrays of first conductive contacts 324, 326, 328 and 330 because of loading effect. Thickness uniformity of the arrays of first conductive contacts 324, 326, 328 and 330 may be affected by loading effect when the metal ratio of the redistribution patterns 322.1 through 322.$r$ is low. Accordingly, the dummy pattern may improve the process window and yields of the CMP process for fabricating the arrays of first conductive contacts 324, 326, 328 and 330.

As illustrated in FIG. 4E, the semiconductor wafer 440 includes redistribution patterns 332.1 through 332.$r$, wherein each of the redistribution patterns 332.1 through 332.$r$ is identical with the redistribution layer 332 as described above in FIG. 3F. In the exemplary embodiment illustrated in FIG. 4E, the array of first conductive contacts 324, the array of second conductive contacts 326, the array of third conductive contacts 328, and the array of fourth conductive contacts 330 are separated or spaced apart from the active region 100A within the semiconductor stack by a distance a. For example, the distance a ranges from about 60 micrometers to about 70 micrometers, such as approximately 65 micrometers. Similarly, the array of first conductive contacts 324, the array of second conductive contacts 326, the array of third conductive contacts 328, and the array of fourth conductive contacts 330 are separated or spaced apart from peripheries, or edges, of their corresponding redistribution patterns 332.1 through 332.$r$ by a distance b. For example, the distance b ranges from about 60 micrometers to about 70 micrometers, such as approximately 65 micrometers (μm). The arrangement of the array of first conductive contacts 324, the array of second conductive contacts 326, the array of third conductive contacts 328, and the array of fourth conductive contacts 330 in the semiconductor wafer 440 is similar with that in the semiconductor wafer 430 except for the locations of the array of first conductive contacts 324 and the array of third conductive contacts 328.

In an exemplary embodiment, the semiconductor wafer 440 includes the horizontal rows of scribe lines 404.1 through 404.$y$ and/or the vertical columns of scribe lines 406.1 through 406.$x$ as described above in FIG. 4A. In the exemplary embodiment illustrated in FIG. 4E, at most one of the array of first conductive contacts 324 and the array of third conductive contacts 328 corresponding to one of the redistribution patterns 332.1 through 332.$r$ is adjacent to the horizontal rows of scribe lines 404.1 through 404.$y$ at any location within the semiconductor wafer 440 and at most one of the array of second conductive contacts 326 and the array of fourth conductive contacts 330 corresponding to one of the redistribution patterns 332.1 through 332.$r$ is adjacent to the vertical columns of scribe lines 406.1 through 406.$x$ at any location within the semiconductor wafer 440. For example, as illustrated in FIG. 4E, the array of third conductive contacts 328 corresponding to the redistribution pattern 332.1 of the integrated circuit component 442.1 is along a first portion of the horizontal row of scribe line 404.1 between the integrated circuit component 442.1 and the integrated circuit component 442.2 and the array of first conductive contacts 324 corresponding to the redistribution pattern 332.2 of the integrated circuit component 442.2 is along a second portion of the horizontal row of scribe line 404.1 between the integrated circuit component 442.1 and the integrated circuit component 442.2. As another example, as illustrated in FIG. 4E, the array of second conductive contacts 326 corresponding to the redistribution pattern 332.1 of the integrated circuit component 442.1 is along a first portion of the vertical column of scribe line 406.1 between the integrated circuit component 442.1 and the integrated circuit component 442.3 and the array of fourth conductive contacts 330 corresponding to the redistribution pattern 332.3 of the integrated circuit component 442.3 is along a second portion of the vertical column of scribe line 406.1 between the integrated circuit component 442.1 and the integrated circuit component 442.3. This configuration and arrangement of the redistribution patterns 332.1 through 332.r facilitates displacement of air during bonding of the semiconductor wafer 440 and other redistribution layers of other electrical, mechanical, and/or electromechanical devices during the bonding of these redistribution layers.

As illustrated in FIG. 4F, the semiconductor wafer 450 includes redistribution patterns 334.1 through 334.r, each of the redistribution patterns 334.1 through 334.r is identical with the redistribution layer 334 as described above in FIG. 3G. In the exemplary embodiment illustrated in FIG. 4F, the array of second conductive contacts 326 and the array of fourth conductive contacts 330 are separated or spaced apart from the active region 100A within the semiconductor stack by a distance a. For example, the distance a ranges from about 60 micrometers to about 70 micrometers, such as approximately 65 micrometers. Similarly, the array of second conductive contacts 326 and the array of fourth conductive contacts 330 are separated or spaced apart from peripheries, or edges, of their corresponding redistribution patterns 334.1 through 334.r by a distance b. For example, the distance b ranges from about 60 micrometers to about 70 micrometers, such as approximately 65 micrometers (µm). The arrangement of the array of second conductive contacts 326 and the array of fourth conductive contacts 330 in the semiconductor wafer 450 may be the same as that in the semiconductor wafer 430 and the detail descriptions of the array of second conductive contacts 326 and the array of fourth conductive contacts 330 in the semiconductor wafer 450 are thus omitted.

In an exemplary embodiment, the semiconductor wafer 450 includes the horizontal rows of scribe lines 404.1 through 404.y and/or the vertical columns of scribe lines 406.1 through 406.x as described above in FIG. 4A. In the exemplary embodiment illustrated in FIG. 4F, at most one of the array of second conductive contacts 326 and the array of fourth conductive contacts 330 corresponding to one of the redistribution patterns 334.1 through 334.r is adjacent to the vertical columns of scribe lines 406.1 through 406.x at any location within the semiconductor wafer 450. For example, as illustrated in FIG. 4F, the array of second conductive contacts 326 corresponding to the redistribution pattern 334.1 of the integrated circuit component 452.1 is along a first portion of the vertical column of scribe line 406.1 between the integrated circuit component 452.1 and the integrated circuit component 452.2 and the array of fourth conductive contacts 330 corresponding to the redistribution pattern 334.3 of the integrated circuit component 452.2 is along a second portion of the vertical column of scribe line 406.1 between the integrated circuit component 452.1 and the integrated circuit component 452.2. This configuration and arrangement of the redistribution patterns 334.1 through 334.r facilitates displacement of air during bonding of the semiconductor wafer 450 and other redistribution layers of other electrical, mechanical, and/or electromechanical devices during the bonding of these redistribution layers.

As illustrated in FIG. 4G, the semiconductor wafer 460 includes redistribution patterns 336.1 through 336.r. In the exemplary embodiment illustrated in FIG. 4G, the arrays of first conductive contacts 324 and the arrays of second conductive contacts 326 are separated or spaced apart from the active region 100A within the semiconductor stack by a distance a. For example, the distance a ranges from about 60 micrometers to about 70 micrometers, such as approximately 65 micrometers. Similarly, the arrays of first conductive contacts 324 and the arrays of second conductive contacts 326 are separated or spaced apart from peripheries, or edges, of their corresponding redistribution patterns 336.1 through 336.r by a distance b. For example, the distance b ranges from about 60 micrometers to about 70 micrometers, such as approximately 65 micrometers (µm). The arrangement of the arrays of first conductive contacts 324 and the arrays of second conductive contacts 326 in the semiconductor wafer 450 may be the same as that in the semiconductor wafer 430 and the detailed descriptions of the arrays of first conductive contacts 324 and the arrays of second conductive contacts 326 in the semiconductor wafer 450 are thus omitted.

As illustrated in FIG. 4H, the semiconductor wafer 470 includes redistribution patterns 338.1 through 338.r. In the exemplary embodiment illustrated in FIG. 4H, the arrays of first conductive contacts 324 and the arrays of third conductive contacts 328 are separated or spaced apart from the active region 100A within the semiconductor stack by a distance a. For example, the distance a ranges from about 60 micrometers to about 70 micrometers, such as approximately 65 micrometers. Similarly, the arrays of first conductive contacts 324 and the arrays of third conductive contacts 328 are separated or spaced apart from peripheries, or edges, of their corresponding redistribution patterns 338.1 through 338.r by a distance b. For example, the distance b ranges from about 60 micrometers to about 70 micrometers, such as approximately 65 micrometers (µm). The arrangement of the arrays of first conductive contacts 324 and the arrays of third conductive contacts 328 in the semiconductor wafer 450 may be the same as that in the semiconductor wafer 430 and the detailed descriptions of the arrays of first conductive contacts 324 and the arrays of third conductive contacts 328 in the semiconductor wafer 450 are thus omitted.

As illustrated in FIG. 4I, the semiconductor wafer 480 includes redistribution patterns 340.1 through 340.r. In the exemplary embodiment illustrated in FIG. 4I, the arrays of first conductive contacts 324 and the arrays of fourth conductive contacts 340 are separated or spaced apart from the active region 100A within the semiconductor stack by a distance a. For example, the distance a ranges from about 60 micrometers to about 70 micrometers, such as approximately 65 micrometers. Similarly, the arrays of first conductive contacts 324 and the arrays of fourth conductive contacts 330 are separated or spaced apart from peripheries, or edges, of their corresponding redistribution patterns 340.1 through 340.r by a distance b. For example, the distance b ranges from about 60 micrometers to about 70 micrometers, such as approximately 65 micrometers (µm). The arrangement of the arrays of first conductive contacts 324 and the arrays of fourth conductive contacts 340 in the semiconductor wafer 450 may be the same as that in the semiconductor wafer 430 and the detailed descriptions of the arrays of first conductive contacts 324 and the arrays of fourth conductive contacts 340 in the semiconductor wafer 450 are thus omitted.

Furthermore, the above-mentioned dummy pattern (e.g., dummy metal pattern as shown in FIG. 4A) may be applied in the embodiments as illustrated FIG. 4E, FIG. 4F, FIG. 4G, FIG. 4H, FIG. 4I and FIG. 4J.

Figure 5:
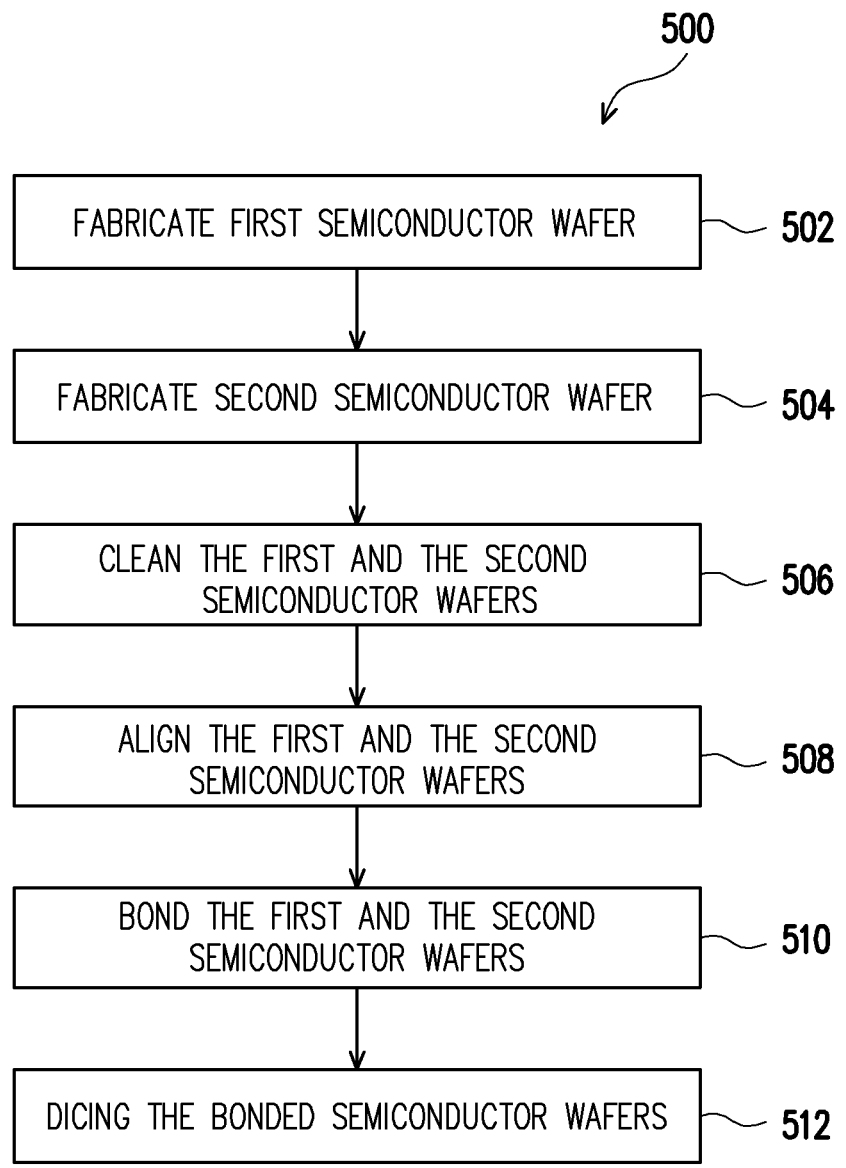
FIG. 5 illustrates a flowchart of exemplary operation for fabricating the exemplary semiconductor wafers including the exemplary integrated circuit components according to an exemplary embodiment of the present disclosure.

FIG. 5 illustrates a flowchart of exemplary operation for fabricating the exemplary semiconductor wafers including the exemplary integrated circuit components according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 500 for fabricating a semiconductor wafer, such as the semiconductor wafer 200 to provide an example.

At operation 502, the exemplary operational control flow 500 fabricates a first semiconductor wafer. The exemplary operational control flow 500 uses a first predetermined sequence of photographic and/or chemical processing operations to form multiple integrated circuit components, such as the integrated circuit components 100.1 through 100.n to provide an example, onto a semiconductor substrate, such as the semiconductor substrate 202 to provide an example, to form the first semiconductor wafer. The first predetermined sequence of photographic and/or chemical processing operations may include deposition, removal, patterning, and modification. The deposition is an operation used to grow, coat, or otherwise transfer a material onto the semiconductor substrate and may include physical vapor deposition (PVD), chemical vapor deposition (CVD), electrochemical deposition (ECD), and/or molecular beam epitaxy (MBE) to provide some examples. The removal is an operation to remove material from the semiconductor substrate and may include wet etching, dry etching, and/or chemical-mechanical planarization (CMP) to provide some examples. The patterning, often referred to as lithography, is an operation to shape or alter material of the semiconductor substrate to form various geometric shapes of the analog and/or digital circuitry for the electronic device. The modification of electrical properties is an operation to alter physical, electrical, and/or chemical properties of material of the semiconductor substrate, typically, by ion implantation.

At operation 504, the exemplary operational control flow 500 fabricates a second semiconductor wafer. The exemplary operational control flow 500 uses a second predetermined sequence of photographic and/or chemical processing operations to form multiple integrated circuit components, such as the integrated circuit components 100.1 through 100.n to provide an example, onto a semiconductor substrate, such as the semiconductor substrate 202 to provide an example, to form the second semiconductor wafer. The second predetermined sequence of photographic and/or chemical processing operations may include the deposition, the removal, the patterning, and the modification as described above in operation 502.

At operation 506, the exemplary operational control flow 500 cleans the first semiconductor wafer from operation 502 and the second semiconductor wafer from operation 504. The exemplary operational control flow 500 removes impurities from a first redistribution layer of the first semiconductor wafer from operation 502 and a second redistribution layer of the second semiconductor wafer from operation 504. The exemplary operational control flow 500 may utilize a dry cleaning, for example, plasma treatments, ultra-violet cleaning, and/or ozone cleaning to provide some examples, and/or a wet chemical cleaning procedure to remove the impurities.

At operation 508, the exemplary operational control flow 500 aligns the first semiconductor wafer from operation 502 and the second semiconductor wafer from operation 504. The exemplary operational control flow 500 aligns the first redistribution layer of the first semiconductor wafer from operation 502 and the second redistribution layer of the second semiconductor wafer from operation 504 for bonding. In an exemplary embodiment, the first redistribution layer of the first semiconductor wafer from operation 502 is a mirror, or substantial mirror, image of the second redistribution layer of the first semiconductor wafer from operation 502 to allow for bonding.

At operation 510, the exemplary operational control flow 500 bonds the first semiconductor wafer from operation 502 and the second semiconductor wafer from operation 504. The exemplary operational control flow 500 using hybrid bonding, direct bonding, surface activated bonding, plasma activated bonding, anodic bonding, eutectic bonding, thermocompression bonding, reactive bonding, transient liquid phase diffusion bonding and/or any other well-known bonding technique which is apparent to those skilled in the relevant art(s) without departing from the spirit and scope of the present disclosure to bond the first semiconductor wafer from operation 502 and the second semiconductor wafer from operation 504.

At operation 512, after performing the bonding process (i.e. the operation 510), the exemplary operational control flow 500 performs a dicing process on the bonded first and second semiconductor wafers (i.e. the bonded structure 210 as illustrated in FIG. 2C) to form singulated semiconductor devices.

The foregoing Detailed Description discloses an integrated circuit. The integrated circuit includes electronic circuitry and a redistribution layer. The electronic circuitry is situated within a semiconductor stack having conductive layers interdigitated with a non-conductive layer situated on a semiconductor substrate. The redistribution layer is situated within a conductive layer from among the conductive layers of the semiconductor stack, the redistribution layer including a first array of conductive contacts extending along a first direction of the redistribution layer. The integrated circuit has been separated from integrated circuit components situated on a semiconductor substrate along scribe lines. A second integrated circuit, including second electronic circuitry, is arranged on the semiconductor substrate to be adjacent to the integrated circuit along a first scribe line, the second integrated circuit including a second array of conductive contacts extending along the first direction. At most of one the first array of conductive contacts and the second array of conductive contacts is situated between the electronic circuitry and the second electronic circuitry along the first scribe line.

The foregoing Detailed Description also discloses a semiconductor wafer. The semiconductor wafer includes a semiconductor substrate and integrated circuit components. The integrated circuit components are situated on the semiconductor substrate, the integrated circuit components including redistribution layers having first arrays of conductive contacts and second arrays of conductive contacts. The first arrays of conductive contacts extend in a first direction along first sides their corresponding integrated circuit components. The second arrays of conductive contacts extend in a second direction along second sides their corresponding integrated circuit components.

The foregoing Detailed Description further discloses a method for fabricating an integrated circuit. The method includes fabricating a first semiconductor wafer, the first semiconductor wafer including first integrated circuit components formed within a first semiconductor stack having first conductive layers interdigitated with first non-conductive layers situated on a semiconductor substrate, fabricating a second semiconductor wafer, the second semiconductor wafer including second integrated circuit components and second redistribution layers situated on a semiconductor substrate, and bonding the first redistribution layers and the second redistribution layers to form the integrated circuit. The first integrated circuit components include first redistribution layers situated within the first conductive layers of the semiconductor stack, each redistribution layer from among the first retribution layers including a corresponding first array of conductive contacts from among first arrays of conductive contacts and a corresponding second array of conductive contacts from among second arrays of conductive contacts. The first arrays of conductive contacts extend in a first direction along first sides of their corresponding integrated circuit components. The second arrays of conductive contacts extend in a second direction along a second sides their corresponding integrated circuit components.

What is claimed is:

1. A method for fabricating a semiconductor device, comprising:
providing a first semiconductor structure comprising first integrated circuits, each of the first integrated circuits comprising an active region and a periphery region surrounding the active region, the periphery region comprising a seal ring that surrounds the active region;
forming a first redistribution layer over the first semiconductor structure, the first redistribution layer comprising a dielectric layer and arrays of first conductive contacts embedded in the dielectric layer, each array of first conductive contacts being respectively disposed on a first area of the periphery region and extending along a first direction, wherein any two most adjacent arrays of first conductive contacts which are aligned with each other in a second direction and respectively disposed on two adjacent first integrated circuits are apart from each other by a first distance, wherein the first distance is greater than a first dimension of the active region in the second direction, and the second direction is substantially perpendicular with the first direction, wherein there are no conductive contacts between the two most adjacent arrays of first conductive contacts;
providing a second semiconductor structure;
forming a second redistribution layer over the second semiconductor structure;
performing a bonding process to bond the first and second redistribution layer to form a bonded structure; and
cutting a first one of the first integrated circuits from a second one of the first integrated circuits along a scribe line located between the two most adjacent arrays of first conductive contacts, wherein after the cutting the first one of the integrated circuits, the seal ring still surrounds the active region.

2. The method of claim 1, wherein the first redistribution layer further comprises arrays of second conductive contacts embedded in the dielectric layer, each array of second conductive contacts are respectively disposed on a second area of the periphery region and extend along the second direction, any two most adjacent arrays of second conductive contacts which are aligned with each other in the first direction and respectively disposed on different first integrated circuits are apart from each other by a second distance, wherein the second distance is greater than a second dimension of the active region in the first direction.

3. The method of claim 1, wherein the first redistribution layer further comprises arrays of second conductive contacts embedded in the dielectric layer, wherein each array of second conductive contacts is respectively disposed on a third area of the periphery region and extend along the first direction, any two most adjacent arrays of third conductive contacts which are aligned with each other in the second direction and respectively disposed on different first integrated circuits are apart from each other by a second distance, the second distance is greater than the first dimension.

4. The method of claim 1, wherein the first redistribution layer further comprises arrays of second conductive contacts embedded in the dielectric layer, each array of second conductive contacts are respectively disposed on a fourth area of the periphery region and extend along the second direction, any two most adjacent arrays of second conductive contacts which are aligned with each other in the first direction and respectively disposed on different first integrated circuits are apart from each other by a second distance, the second distance is greater than a second dimension of the active region in the first direction.

5. The method of claim 1 further comprising:
after performing the bonding process, performing a dicing process on the bonded structure to form singulated semiconductor devices.

6. The method of claim 1, wherein a bonding wave is applied to the first and second semiconductor structures during the bonding process to drive away air between the first and second redistribution layers.

7. The method of claim 6, wherein a bonding interface between the first redistribution layer and the second redistribution layer in the bonded structure is void free after performing the bonding process.

8. A method for fabricating a semiconductor device, comprising:
providing a first semiconductor structure comprising a first integrated circuit and a second integrated circuit, each of the first and second integrated circuits, comprising an active region and a periphery region surrounding the active region, the active region comprising a majority of a surface area of the first integrated circuit;
forming a first redistribution layer over the first semiconductor structure, the first redistribution layer comprising a dielectric layer, a first array of first conductive contacts embedded in the dielectric layer and a second array of first conductive contacts embedded in the dielectric layer, the first array of first conductive contacts being disposed on the periphery region of the first integrated circuit, the second array of first conductive contacts being disposed on the periphery region of the second integrated circuit, the first and second arrays of first conductive contacts extending along a first direction, the first integrated circuit being most adjacent to the second integrated circuit in a second direction substantially perpendicular with the first direction, wherein the first and second arrays of first conductive contacts which are aligned with each other in the second direction are apart from each other by a first distance in the second direction, and the first distance is greater than a first dimension of the active region in the second direction, wherein there are no conductive contacts between the first and second arrays;
providing a second semiconductor structure;
forming a second redistribution layer over the second semiconductor structure;

performing a bonding process to bond the first and second redistribution layer to form a bonded structure; and separating the first integrated circuit from the second integrated circuit by cutting through a scribe region located between the first integrated circuit and the second integrated circuit, the first array of first conductive contacts having a width that is larger than a width of the active region.

9. The method of claim 8, wherein the first redistribution layer further comprises:
a first array of second conductive contacts embedded in the dielectric layer; and
a second array of second conductive contacts embedded in the dielectric layer,
wherein the first array of second conductive contacts are disposed on the periphery region of the first integrated circuit, the second array of second conductive contacts are disposed on the periphery region of the second integrated circuit, the first and second arrays of second conductive contacts extend along the second direction, the first and second arrays of second conductive contacts which are aligned with each other in the first direction are apart from each other by a second distance, and the second distance is greater than a second dimension of the active region in the first direction.

10. The method of claim 8, wherein the first redistribution layer further comprises:
a first array of third conductive contacts embedded in the dielectric layer; and
a second array of third conductive contacts embedded in the dielectric layer, wherein the first array of third conductive contacts are disposed on the periphery region of the first integrated circuit, the second array of third conductive contacts are disposed on the periphery region of the second integrated circuit, the first and second arrays of third conductive contacts extend along the first direction, the first and second arrays of third conductive contacts which are aligned with each other in the second direction are apart from each other by a third distance, and the third distance is greater than the first dimension.

11. The method of claim 10, wherein the first redistribution layer further comprises:
a first array of second conductive contacts embedded in the dielectric layer; and
a second array of second conductive contacts embedded in the dielectric layer,
wherein the first array of second conductive contacts are disposed on the periphery region of the first integrated circuit, the second array of second conductive contacts are disposed on the periphery region of the second integrated circuit, the first and second arrays of second conductive contacts extend along the second direction, the first and second arrays of second conductive contacts which are aligned with each other in the first direction are apart from each other by a second distance, and the second distance is greater than a second dimension of the active region in the first direction.

12. The method of claim 8 further comprising:
after performing the bonding process, performing a dicing process on the bonded structure to form singulated semiconductor devices.

13. The method of claim 8, wherein a bonding wave is applied to the first and second semiconductor structures during the bonding process to drive away air between the first and second redistribution layers.

14. The method of claim 13, wherein a bonding interface between the first redistribution layer and the second redistribution layer in the bonded structure is void free after performing the bonding process.

15. A method of manufacturing a semiconductor device, the method comprising:
forming a first semiconductor structure comprising first integrated circuits, each of the first integrated circuits comprising an active region and a periphery region surrounding the active region, wherein the periphery region is free of electronic circuitry;
forming a first redistribution layer disposed over the first semiconductor structure, the first redistribution layer comprising a dielectric layer and arrays of first conductive contacts embedded in the dielectric layer, wherein each array within the arrays of first conductive contacts has at least five rows of multiple first conductive contacts, each array of first conductive contacts being respectively disposed entirely on a first area of the periphery region and extending along a first direction, wherein any two most adjacent arrays of first conductive contacts which are aligned with each other in a second direction and respectively disposed on two adjacent first integrated circuits are apart from each other by a distance, wherein the distance is greater than a first dimension of the active region in the second direction, and the second direction is substantially perpendicular with the first direction, wherein there are no conductive contacts between the two most adjacent arrays of first conductive contacts;
forming a second redistribution layer disposed over a second semiconductor structure, wherein a pattern of the arrays of first conductive contacts is substantially the same as a pattern of second conductive contacts in the second redistribution layer;
bonding the first and second redistribution layers such that the first and second semiconductor structures are bonded through the first and second redistribution layers; and
separating the first integrated circuits from each other by cutting through a scribe region located between the first integrated circuits.

16. The method of claim 15, wherein the first semiconductor structure comprises a first semiconductor substrate and a first interconnection structure disposed on the first semiconductor substrate, and the arrays of first conductive contacts are electrically connected to the first interconnection structure.

17. The method of claim 15, wherein a bonding interface between the first redistribution layer and the second redistribution layer is void free.

18. The method of claim 15, wherein the first integrated circuits are arranged in array, the second semiconductor structure comprising second integrated circuits are arranged in array, and each of the first integrated circuits is bonded with one of the second integrated circuits respectively.

19. The method of claim 15, wherein each array of first conductive contacts is arranged in a plurality of rows and a plurality of columns.

20. The method of claim 15, wherein an arrangement pitch of each array of first conductive contacts ranges from about 3 micrometers to about 5 micrometers.

* * * * *